US012625203B2

(12) United States Patent
Kojima et al.

(10) Patent No.: US 12,625,203 B2
(45) Date of Patent: May 12, 2026

(54) MAGNETIC SYSTEM INCLUDING A MAGNETORESISTIVE ELEMENT DISPOSED ON AN INCLINED SURFACE

(71) Applicant: TDK CORPORATION, Tokyo (JP)

(72) Inventors: Hidekazu Kojima, Tokyo (JP); Keita Kawamori, Tokyo (JP); Hiromichi Umehara, Tokyo (JP); Yoshitaka Sasaki, Uniondale, NY (US)

(73) Assignee: TDK CORPORATION, Tokyo (JP)

( * ) Notice: Subject to any disclaimer, the term of this patent is extended or adjusted under 35 U.S.C. 154(b) by 225 days.

(21) Appl. No.: 18/664,960

(22) Filed: May 15, 2024

(65) Prior Publication Data

US 2025/0355065 A1 Nov. 20, 2025

(51) Int. Cl.
G01R 33/09 (2006.01)
G01R 33/00 (2006.01)

(52) U.S. Cl.
CPC ......... G01R 33/09 (2013.01); G01R 33/0052 (2013.01)

(58) Field of Classification Search
CPC ............... G01R 33/09; G01R 33/0052; G01R 33/0005; G01R 33/0094; G01R 33/0206; G01R 33/093; G01R 33/098
See application file for complete search history.

(56) References Cited

U.S. PATENT DOCUMENTS

| | | | |
|---|---|---|---|
| 8,018,229 B1* | 9/2011 | Horning | G01R 33/0206 |
| | | | 324/252 |
| 2006/0176142 A1 | 8/2006 | Naito et al. | |
| 2008/0316654 A1 | 12/2008 | Aiso | |
| 2009/0015251 A1 | 1/2009 | Azumi et al. | |
| 2012/0272514 A1* | 11/2012 | Naito | B82Y 25/00 |
| | | | 29/602.1 |
| 2013/0134970 A1* | 5/2013 | Schuhl | G01R 33/098 |
| | | | 427/127 |
| 2016/0109534 A1* | 4/2016 | Dieny | G01R 35/005 |
| | | | 324/252 |
| 2018/0275219 A1* | 9/2018 | Umetsu | G01R 33/093 |
| 2021/0302511 A1 | 9/2021 | Makino et al. | |

* cited by examiner

*Primary Examiner* — Alvaro E Fortich
(74) *Attorney, Agent, or Firm* — Oliff PLC

(57) ABSTRACT

A magnetic sensor includes a substrate having a reference plane, a support member having an inclined surface, and a magnetoresistive element disposed on the inclined surface. The magnetoresistive element has a bottom surface, a top surface, and a first side surface and a second side surface connecting the bottom surface and the top surface. The first side surface is, as compared to the second side surface, located in front in a first direction that is along the inclined surface and that gets close to the reference plane. At least a part of the first side surface is, as compared to a first virtual plane, located close to the second side surface, and the first virtual plane intersects with a first corner present at a position at where the top surface and the first side surface intersect and is perpendicular to the reference plane.

15 Claims, 23 Drawing Sheets

2

61A 50A 62A    61A 50A 62A    61A 50A 62A 205
204
203
202
201

201a

Z
Y⊗→X

MAGNETIC SYSTEM INCLUDING A MAGNETORESISTIVE ELEMENT DISPOSED ON AN INCLINED SURFACE

BACKGROUND

The technology relates to a magnetic sensor including a magnetoresistive element disposed on an inclined surface.

Magnetic sensors using magnetoresistive elements have been used for various applications in recent years. A system including a magnetic sensor may be intended to detect a magnetic field containing a component in a direction perpendicular to the surface of a substrate by using a magnetoresistive element provided on the substrate. In such a case, the magnetic field containing the component in the direction perpendicular to the surface of the substrate can be detected by providing a soft magnetic body for converting a magnetic field in the direction perpendicular to the surface of the substrate into a magnetic field in a direction parallel to the surface of the substrate or locating the magnetoresistive element on an inclined surface formed on the substrate.

US 2008/0,316,654 A1 discloses a three-axis magnetic sensor including a plurality of giant magnetoresistive elements formed on a flat surface and a plurality of giant magnetoresistive elements formed on an inclined surface. US 2021/0,302,511 A1 discloses a magnetic sensor including a plurality of magnetoresistive elements disposed on an inclined surface. In these magnetic sensors, a side surface of the magnetoresistive elements has a forward-tapered shape relative to the inclined surface.

In magnetic sensors, in order to suppress change in output in a case that the strength of a magnetic field applied is zero, a free layer may have a shape magnetic anisotropy. However, when a side surface of a magnetoresistive element has a tapered shape, such a shape magnetic anisotropy of the free layer is caused to be small. The shape magnetic anisotropy of the free layer can be made greater by making the width of the magnetoresistive element narrower. This, however, causes the sensitivity of the magnetoresistive element to be lowered. These problems are significant when the magnetoresistive element is disposed on an inclined surface.

SUMMARY

A magnetic sensor according to an embodiment of the technology includes a substrate having a reference plane, a support member that is disposed on the substrate and that has an inclined surface inclined relative to the reference plane, and a magnetoresistive element disposed on the inclined surface. The magnetoresistive element has a bottom surface facing the inclined surface, a top surface located opposite to the bottom surface, and a first side surface and a second side surface connecting the bottom surface and the top surface. The first side surface is, as compared to the second side surface, located in front in a first direction that is along the inclined surface and that gets close to the reference plane. The second side surface is, as compared to the first side surface, located in front in a second direction that is along the inclined surface and that gets away from the reference plane. At least a part of the first side surface is, as compared to a first virtual plane, located close to the second side surface, and the first virtual plane intersects with a first corner present at a position at where the top surface and the first side surface intersect and is perpendicular to the reference plane.

In the magnetic sensor according to an embodiment of the technology, the magnetoresistive element is disposed on the inclined surface. At least a part of the first side surface of the magnetoresistive element is, as compared to the first virtual plane, located close to the second side surface of the magnetoresistive element. With this, an embodiment of the technology enables suppression of occurrence of a problem due to the shape of a side surface of the magnetoresistive element disposed on the inclined surface.

Other and further objects, features and advantages of the technology will appear more fully from the following description.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the technology.

DETAILED DESCRIPTION

Figure 1:
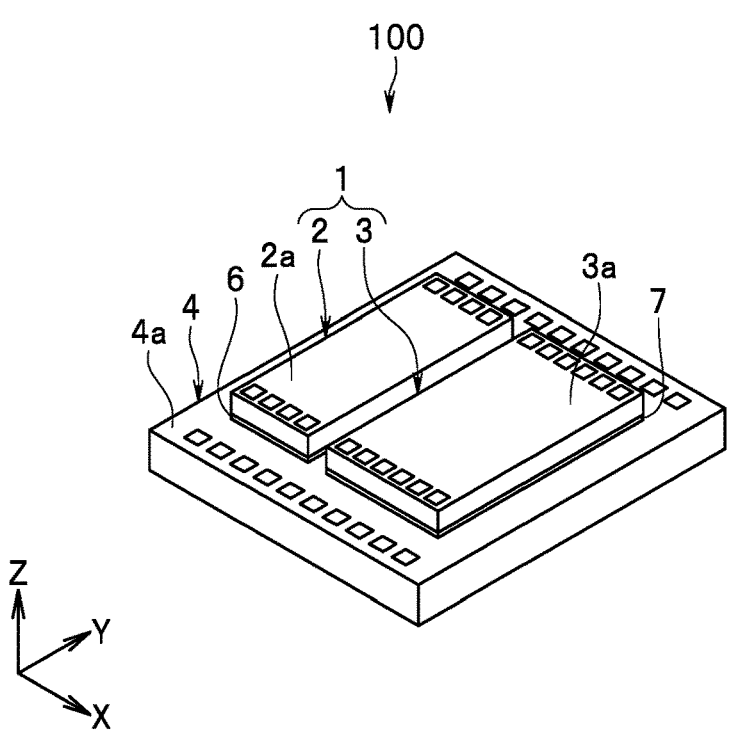
FIG. 1 is a perspective view showing a magnetic sensor device including a magnetic sensor according to a first example embodiment of the technology.

An object of the technology is to provide a magnetic sensor that enables suppression of occurrence of a problem due to the shape of a side surface of a magnetoresistive element disposed on an inclined surface.

In the following, some example embodiments and modification examples of the technology are described in detail with reference to the accompanying drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions. Note that the description is given in the following order.

First Example Embodiment

Figure 2:
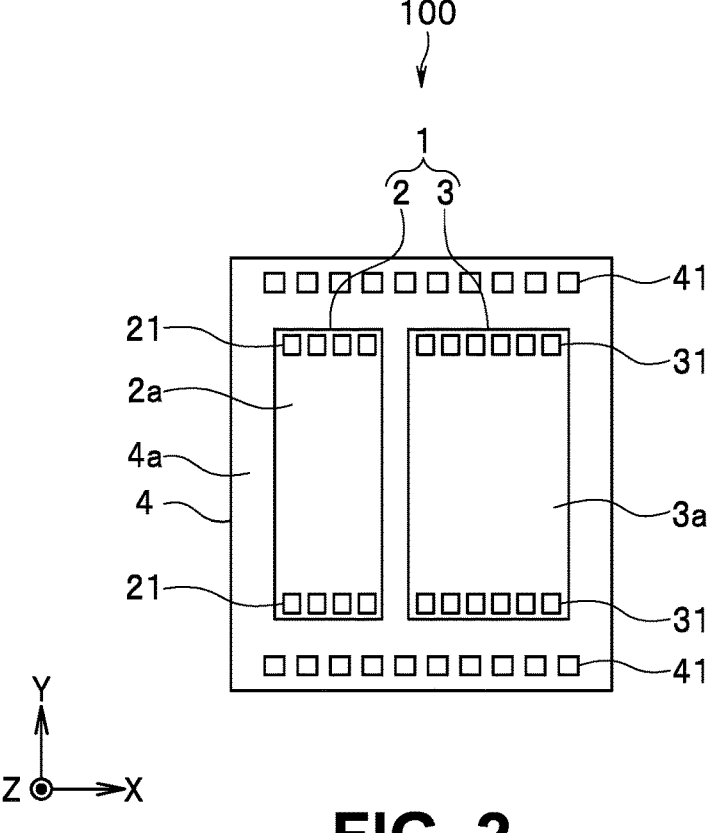
FIG. 2 is a plan view showing the magnetic sensor device shown in FIG. 1.
Figure 3:
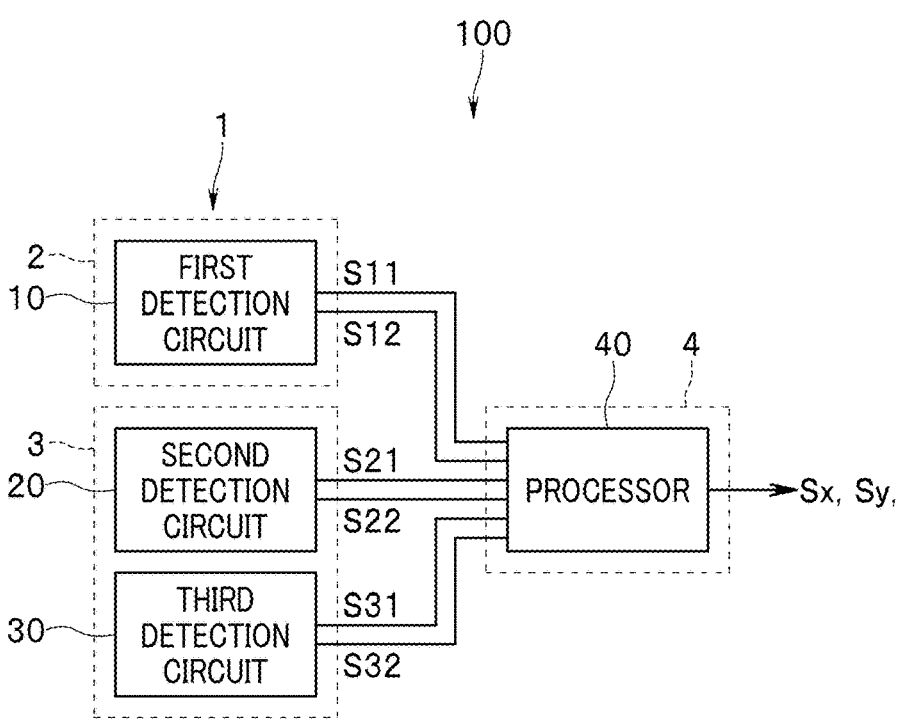
FIG. 3 is a functional block diagram showing a configuration of the magnetic sensor device shown in FIG. 1.

A configuration of a magnetic sensor device including a magnetic sensor according to a first example embodiment of the technology will initially be described with reference to FIGS. 1 to 3. FIG. 1 is a perspective view showing a magnetic sensor device 100. FIG. 2 is a plan view showing the magnetic sensor device 100. FIG. 3 is a functional block diagram showing a configuration of the magnetic sensor device 100.

The magnetic sensor device 100 includes a magnetic sensor 1. The magnetic sensor 1 includes a first chip 2 and a second chip 3. The magnetic sensor device 100 further includes a support 4 that supports the first chip 2 and the second chip 3. The first chip 2, the second chip 3, and the support 4 each have a rectangular solid shape. The support 4 has a reference plane 4a that is a top surface, a bottom surface located opposite to the reference plane 4a, and four side surfaces connecting the reference plane 4a and the bottom surface.

Now, a description will be given of a reference coordinate system in the present example embodiment with reference to FIGS. 1 and 2. The reference coordinate system is an orthogonal coordinate system that is set with reference to the magnetic sensor device 100 and defined by three axes. An X direction, a Y direction, and a Z direction are defined in the reference coordinate system. The X, Y, and Z directions are orthogonal to each other. In particular, in the example embodiment, a direction that is perpendicular to the reference plane 4a of the support 4 and directed from the bottom surface of the support 4 to the reference plane 4a is referred to as the Z direction. The opposite directions to the X, Y, and Z directions will be expressed as −X, −Y, and −Z directions, respectively. The three axes defining the reference coordinate system are an axis parallel to the X direction, an axis parallel to the Y direction, and an axis parallel to the Z direction.

Hereinafter, the term "above" refers to positions located forward of a reference position in the Z direction, and "below" refers to positions opposite from the "above" positions with respect to the reference position. For each component of the magnetic sensor device 100, the term "top surface" refers to a surface of the component lying at the end thereof in the Z direction, and "bottom surface" refers to a surface of the component lying at the end thereof in the −Z direction. The expression "when seen in the Z direction" means that an intended object is seen from a position at a distance in the Z direction.

The first chip 2 has a top surface 2a and a bottom surface located opposite to each other, and four side surfaces connecting the top surface 2a and the bottom surface. The second chip 3 has a top surface 3a and a bottom surface located opposite to each other, and four side surfaces connecting the top surface 3a and the bottom surface.

The first chip 2 is mounted on the reference plane 4a in a posture such that the bottom surface of the first chip 2 faces the reference plane 4a of the support 4. The second chip 3 is mounted on the reference plane 4a in a posture such that the bottom surface of the second chip 3 faces the reference plane 4a of the support 4. The first chip 2 and the second chip 3 are bonded to the support 4 with, for example, adhesives 6 and 7, respectively.

The first chip 2 has a plurality of first electrode pads 21 disposed on the top surface 2a. The second chip 3 has a plurality of second electrode pads 31 disposed on the top surface 3a. The support 4 has a plurality of third electrode pads 41 disposed on the reference plane 4a. Although not shown, in the magnetic sensor device 100, among the plurality of first electrode pads 21, the plurality of second electrode pads 31, and the plurality of third electrode pads 41, corresponding pairs are connected with bonding wires.

The magnetic sensor 1 includes a first detection circuit 10, a second detection circuit 20, and a third detection circuit 30. The first chip 2 includes the first detection circuit 10. The second chip 3 includes the second and third detection circuits 20 and 30.

The magnetic sensor device 100 further includes a processor 40. The support 4 includes the processor 40. The first to third detection circuits 10, 20, and 30 and the processor 40 are connected via the plurality of first electrode pads 21, the plurality of second electrode pads 31, the plurality of third electrode pads 41, and a plurality of bonding wires.

The first to third detection circuits 10, 20, and 30 each include a plurality of magnetic detection elements, and are configured to detect a target magnetic field and generate at least one detection signal. In particular, in the example embodiment, the plurality of magnetic detection elements are a plurality of magnetoresistive elements. The magnetoresistive elements will hereinafter be referred to as MR elements.

The processor 40 is configured to generate a first detection value, a second detection value, and a third detection value by processing the plurality of detection signals generated by the first to third detection circuits 10, 20, and 30. The first, second, and third detection values have a correspondence with components of the magnetic field in three respective different directions at a predetermined reference position. In particular, in the present example embodiment, the foregoing three different directions are two directions parallel to an XY plane and a direction parallel to the Z direction. For example, the processor 40 is constructed of an application-specific integrated circuit (ASIC).

Figure 4:
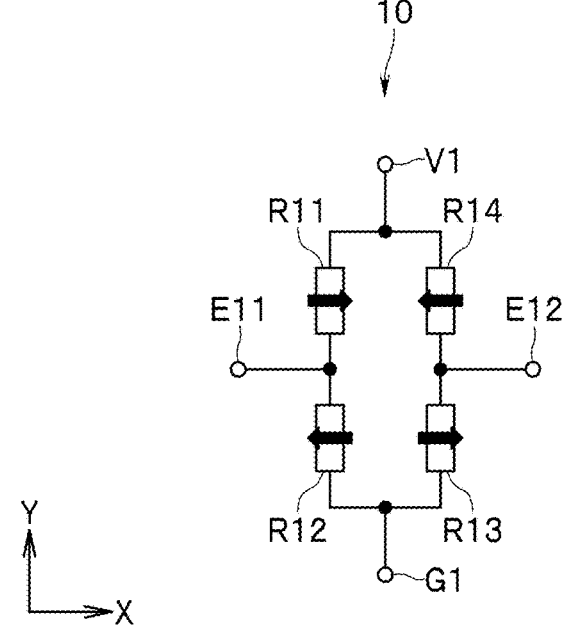
FIG. 4 is a circuit diagram showing a circuit configuration of a first detection circuit of the first example embodiment of the technology.
Figure 5:
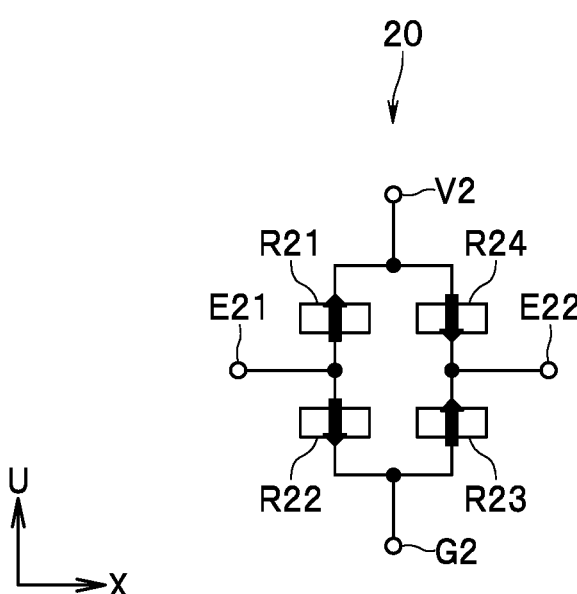
FIG. 5 is a circuit diagram showing a circuit configuration of a second detection circuit of the first example embodiment of the technology.
Figure 6:
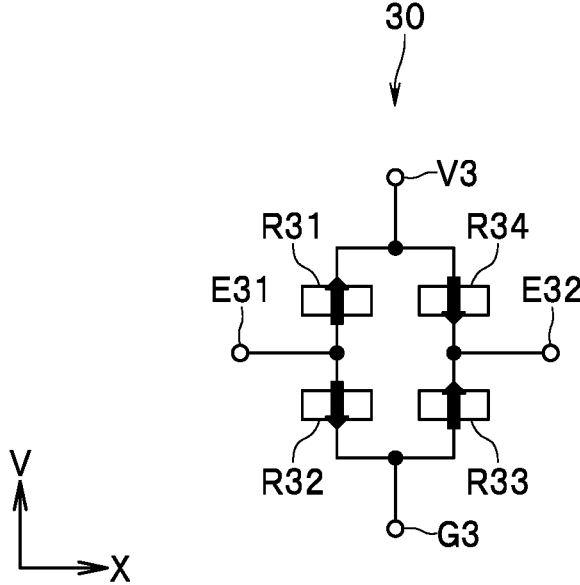
FIG. 6 is a circuit diagram showing a circuit configuration of a third detection circuit of the first example embodiment of the technology.
Figure 7:
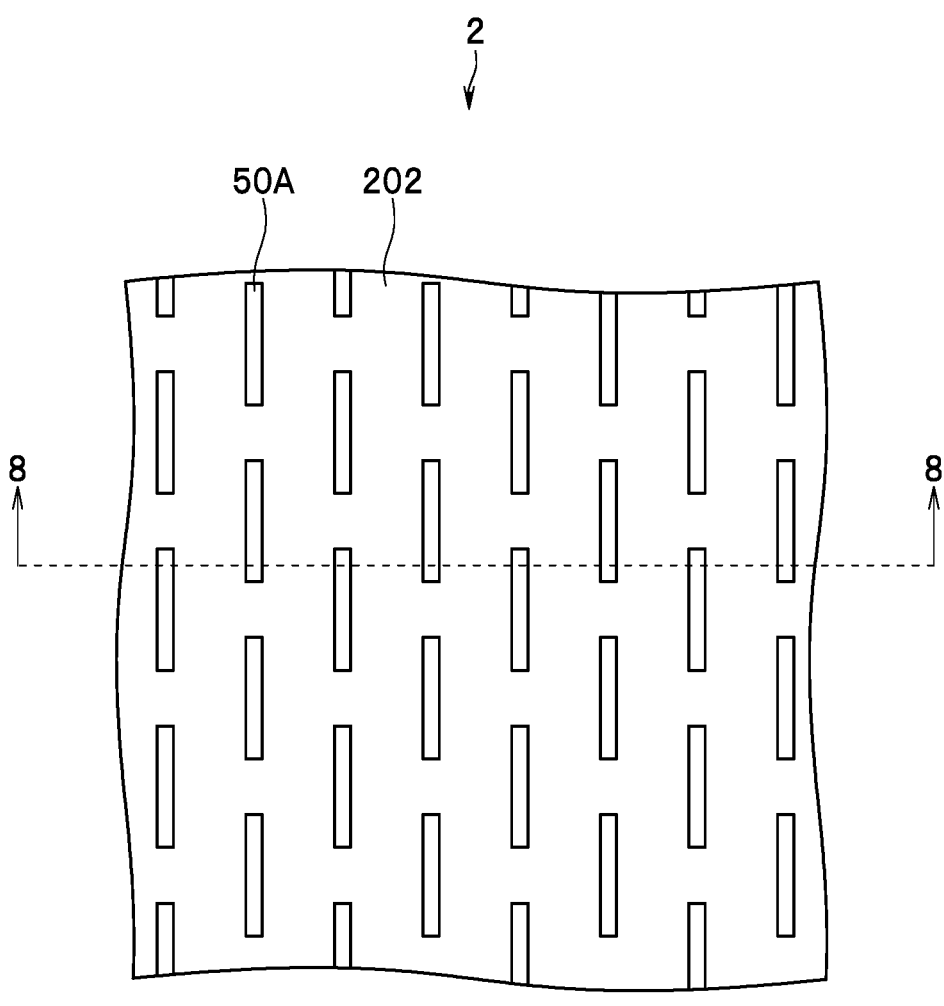
FIG. 7 is a plan view showing a part of a first chip of the first example embodiment of the technology.
Figure 7:
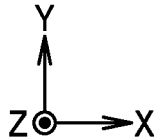
Figure 8:
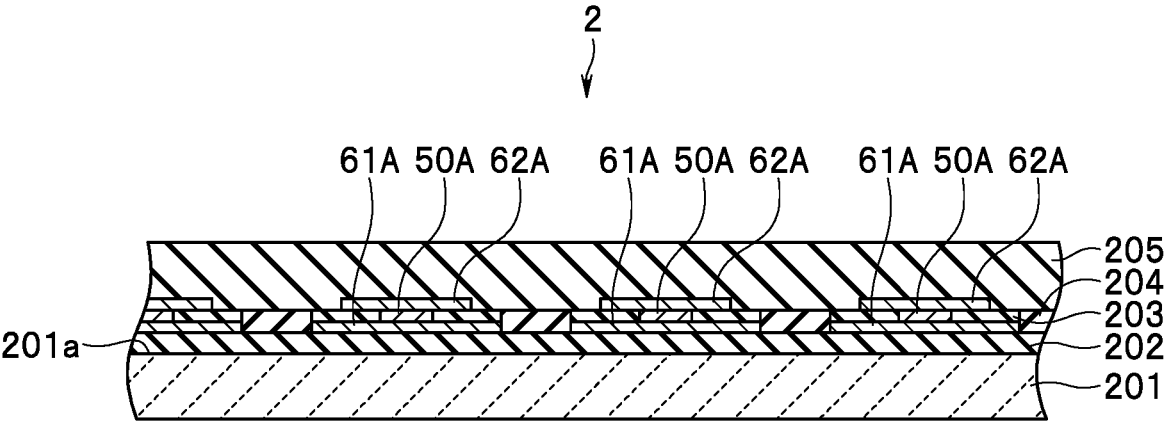
FIG. 8 is a sectional view showing a part of the first chip of the first example embodiment of the technology.
Figure 8:
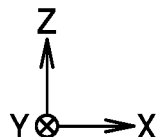
Figure 9:
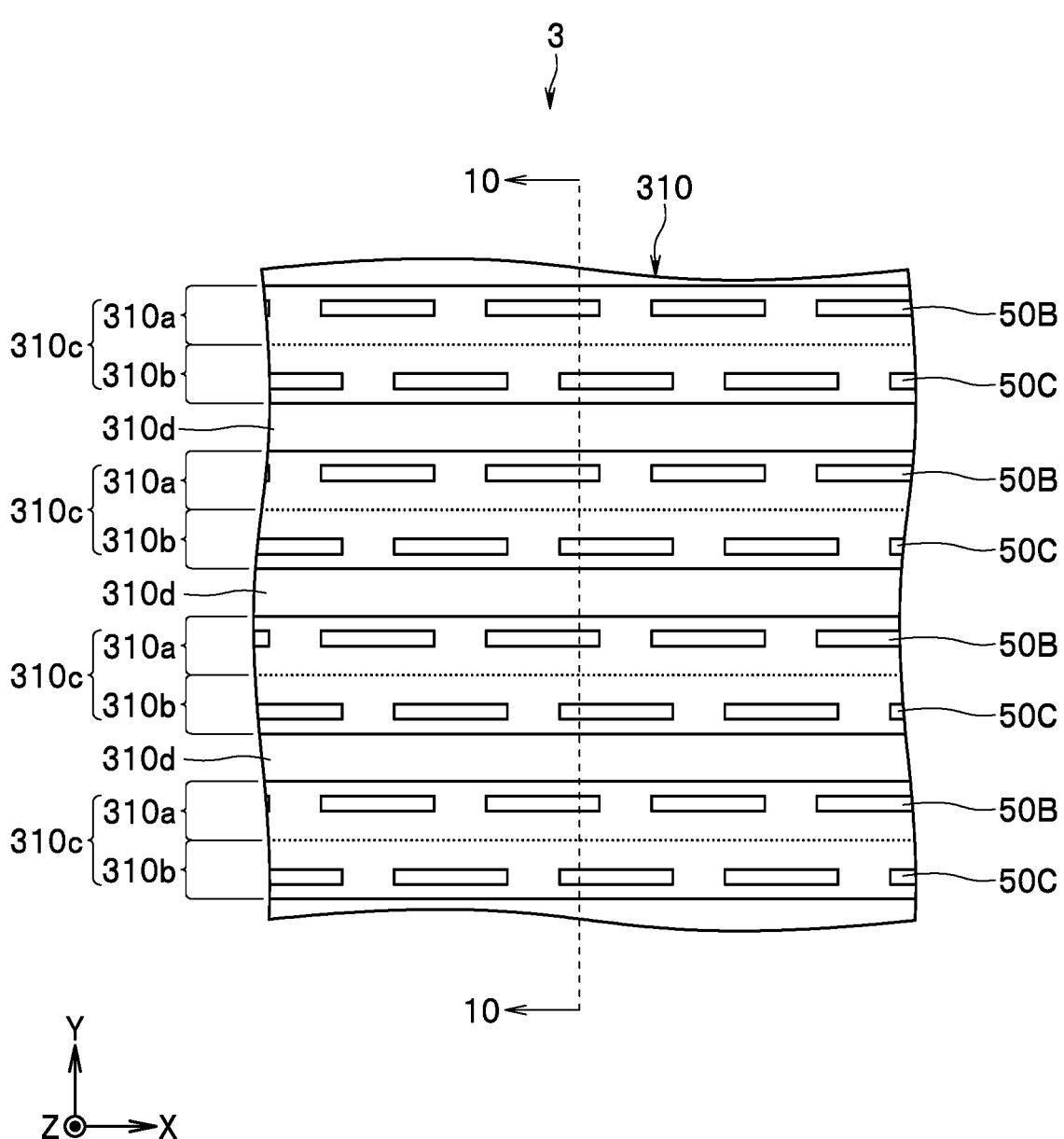
FIG. 9 is a plan view showing a part of a second chip of the first example embodiment of the technology.
Figure 10:
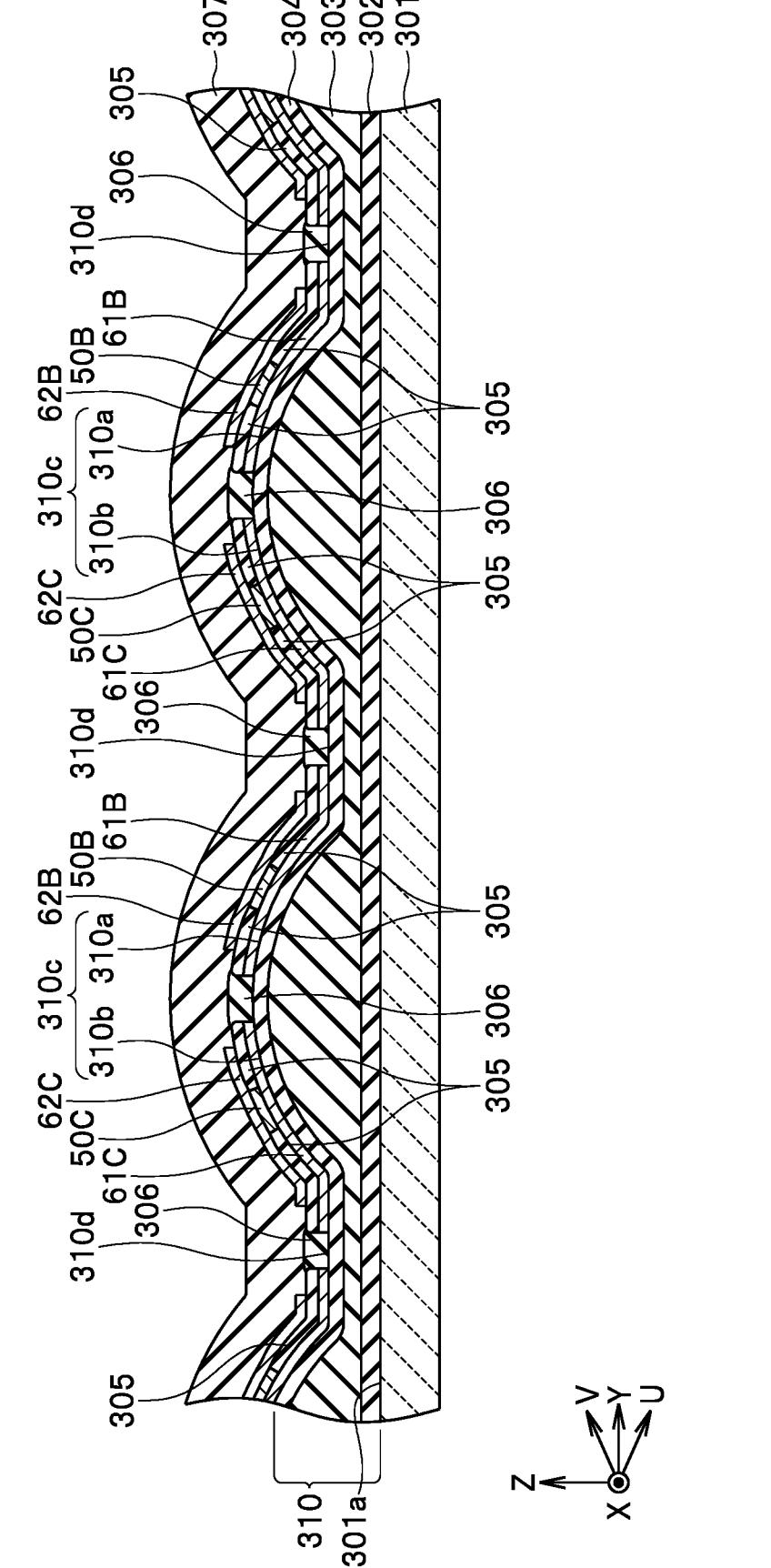
FIG. 10 is a sectional view showing a part of the second chip of the first example embodiment of the technology.

Next, the first to third detection circuits 10, 20, and 30 will be described with reference to FIGS. 3 to 10. FIG. 4 is a circuit diagram showing a circuit configuration of the first detection circuit 10. FIG. 5 is a circuit diagram showing a circuit configuration of the second detection circuit 20. FIG. 6 is a circuit diagram showing a circuit configuration of the third detection circuit 30. FIG. 7 is a plan view showing a part of the first chip 2. FIG. 8 is a sectional view showing a part of the first chip 2. FIG. 9 is a plan view showing a part of the second chip 3. FIG. 10 is a sectional view showing a part of the second chip 3.

Here, as shown in FIG. 10, a U direction and a V direction are defined as follows. The U direction is a direction rotated from the Y direction to the −Z direction. The V direction is a direction rotated from the Y direction to the Z direction. In particular, in the example embodiment, the U direction is set to a direction rotated from the Y direction to the −Z direction by α, and the V direction is set to a direction rotated from the Y direction to the Z direction by α. Note that α is an angle greater than 0° and smaller than 90°. A −U direction refers to a direction opposite to the U direction, and a −V direction refers to a direction opposite to the V direction. The U direction and V direction both are orthogonal to the X direction.

The first detection circuit 10 is configured to detect a component of the target magnetic field in a direction parallel to the X direction and generate at least one first detection signal that has a correspondence with the component. The second detection circuit 20 is configured to detect a component of the target magnetic field in a direction parallel to the U direction and generate at least one second detection signal that has a correspondence with the component. The third detection circuit 30 is configured to detect a component of the target magnetic field in a direction parallel to the V direction and generate at least one third detection signal that has a correspondence with the component.

As shown in FIG. 4, the first detection circuit 10 includes a power supply port V1, a ground port G1, signal output ports E11 and E12, a first resistor section R11, a second resistor section R12, a third resistor section R13, and a fourth resistor section R14. The plurality of MR elements of the first detection circuit 10 constitute the first to fourth resistor sections R11, R12, R13, and R14.

The first resistor section R11 is provided between the power supply port V1 and the signal output port E11. The second resistor section R12 is provided between the signal output port E11 and the ground port G1. The third resistor section R13 is provided between the signal output port E12 and the ground port G1. The fourth resistor section R14 is provided between the power supply port V1 and the signal output port E12.

As shown in FIG. 5, the second detection circuit 20 includes a power supply port V2, a ground port G2, signal output ports E21 and E22, a first resistor section R21, a second resistor section R22, a third resistor section R23, and a fourth resistor section R24. The plurality of MR elements of the second detection circuit 20 constitute the first to fourth resistor sections R21, R22, R23, and R24.

The first resistor section R21 is provided between the power supply port V2 and the signal output port E21. The second resistor section R22 is provided between the signal output port E21 and the ground port G2. The third resistor section R23 is provided between the signal output port E22 and the ground port G2. The fourth resistor section R24 is provided between the power supply port V2 and the signal output port E22.

As shown in FIG. 6, the third detection circuit 30 includes a power supply port V3, a ground port G3, signal output ports E31 and E32, a first resistor section R31, a second resistor section R32, a third resistor section R33, and a fourth resistor section R34. The plurality of MR elements of the third detection circuit 30 constitute the first to fourth resistor sections R31, R32, R33, and R34.

The first resistor section R31 is provided between the power supply port V3 and the signal output port E31. The second resistor section R32 is provided between the signal output port E31 and the ground port G3. The third resistor section R33 is provided between the signal output port E32 and the ground port G3. The fourth resistor section R34 is provided between the power supply port V3 and the signal output port E32.

A voltage or current of predetermined magnitude is applied to each of the power supply ports V1 to V3. Each of the ground ports G1 to G3 is connected to the ground.

The plurality of MR elements of the first detection circuit 10 will hereinafter be referred to as a plurality of first MR elements 50A. The plurality of MR elements of the second detection circuit 20 will be referred to as a plurality of second MR elements 50B. The plurality of MR elements of the third detection circuit 30 will be referred to as a plurality of third MR elements 50C. Since the first to third detection circuits 10, 20, and 30 are components of the magnetic sensor 1, it can be said that the magnetic sensor 1 includes the plurality of first MR elements 50A, the plurality of second MR elements 50B, and the plurality of third MR elements 50C. Any given MR element will be denoted by the reference numeral 50.

Figure 11:
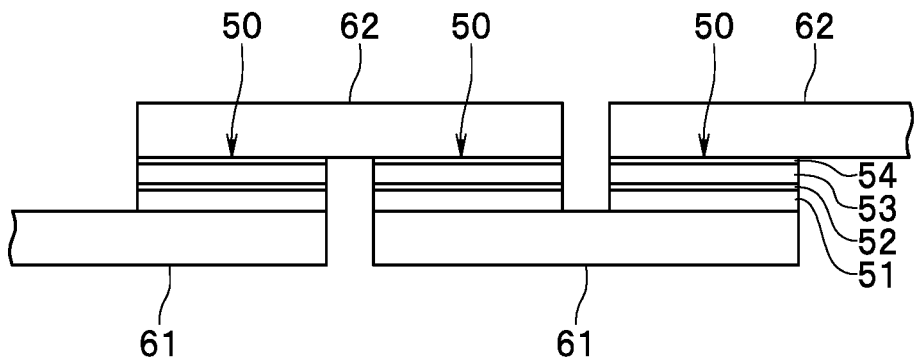
FIG. 11 is a side view showing a magnetoresistive element of the first example embodiment of the technology.

FIG. 11 is a side view showing an MR element 50. The MR element 50 is specifically a spin-valve MR element. The MR element 50 includes a magnetization pinned layer 51 having a magnetization whose direction is fixed, a free layer 53 having a magnetization whose direction is variable depending on the direction of a target magnetic field being an external magnetic field, and a gap layer 52 located between the magnetization pinned layer 51 and the free layer 53. The MR element 50 may be a tunneling magnetoresistive (TMR) element or a giant magnetoresistive (GMR) element. In the TMR element, the gap layer 52 is a tunnel barrier layer. In the GMR element, the gap layer 52 is a nonmagnetic conductive layer. The resistance of the MR element 50 changes with the angle that the magnetization direction of the free layer 53 forms with respect to the magnetization direction of the magnetization pinned layer 51. The resistance of the MR element 50 is at its minimum value when the foregoing angle is 0°, and at its maximum value when the foregoing angle is 180°. In each MR element 50, the free layer 53 has a shape anisotropy that sets the direction of the magnetization easy axis to be orthogonal to the magnetization direction of the magnetization pinned layer 51. As a method for setting the magnetization easy axis in a predetermined direction in the free layer 53, a magnet configured to apply a bias magnetic field to the free layer 53 can be used.

The magnetization pinned layer 51 may be a so-called self-pinned layer (Synthetic Ferri Pinned layer, SFP layer). The self-pinned layer has a stacked ferri structure in which a ferromagnetic layer, a nonmagnetic intermediate layer, and a ferromagnetic layer are stacked, and the two ferromagnetic layers are antiferromagnetically coupled.

The MR element 50 further includes a cap layer 54 located on the free layer 53. The cap layer 54 is formed of, for example, a nonmagnetic conductive material such as Ru or Ta.

Note that the layers 51 to 53 of each MR element 50 may be stacked in the reverse order to that shown in FIG. 11.

In FIGS. 4 to 6, solid arrows represent the magnetization directions of the magnetization pinned layers 51 of the MR elements 50. In the example shown in FIG. 4, the magnetization direction of the magnetization pinned layer 51 in each of the first and third resistor sections R11 and R13 is the X direction. The magnetization direction of the magnetization pinned layer 51 in each of the second and fourth resistor sections R12 and R14 is the –X direction. The free layer 53 in each of the plurality of first MR elements 50A has a shape anisotropy that sets the direction of the magnetization easy axis to a direction parallel to the Y direction.

In the example shown in FIG. 5, the magnetization direction of the magnetization pinned layer 51 in each of the first and third resistor sections R21 and R23 is the U direction. The magnetization direction of the magnetization pinned layer 51 in each of the second and fourth resistor sections R22 and R24 is the –U direction. The free layer 53 in each of the plurality of second MR elements 50B has a shape anisotropy that sets the direction of the magnetization easy axis to a direction parallel to the X direction.

In the example shown in FIG. 6, the magnetization direction of the magnetization pinned layer 51 in each of the first and third resistor sections R31 and R33 is the V direction. The magnetization direction of the magnetization pinned layer 51 in each of the second and fourth resistor sections R32 and R34 is the –V direction. The free layer 53 in each of the plurality of third MR elements 50C has a shape anisotropy that sets the direction of the magnetization easy axis to the direction parallel to the X direction.

Note that, in view of the manufacturing accuracy of the MR elements 50 or the like, the magnetization directions of the magnetization pinned layers 51 may be slightly deviate from the foregoing directions. The magnetization pinned layers 51 may be magnetized to include magnetization components having the foregoing directions as their main components. In such a case, the magnetization directions of the magnetization pinned layers 51 are the same or substantially the same as the foregoing directions.

The magnetic sensor 1 may include a magnetic field generator (not shown) configured to apply a magnetic field in a predetermined direction to the free layer 53 of each of the plurality of first MR elements 50A, the plurality of second MR elements 50B, and the plurality of third MR elements 50C.

A specific structure of the first and second chips 2 and 3 will be described in detail below. FIG. 8 shows a part of a cross section at the position indicated by the line 8-8 in FIG. 7.

The first chip 2 includes a substrate 201 having a top surface 201*a*, insulating layers 202, 203, 204, and 205, a plurality of lower electrodes 61A, and a plurality of upper electrodes 62A. The top surface 201*a* of the substrate 201 is parallel to the XY plane. The Z direction is also a direction perpendicular to the top surface 201*a* of the substrate 201. Note that, since the first chip 2 is a component of the magnetic sensor 1, it can be said that the magnetic sensor 1 includes the substrate 201, the insulating layers 202 to 205, the plurality of lower electrodes 61A, and the plurality of upper electrodes 62A.

The insulating layer 202 is disposed on the substrate 201. The plurality of lower electrodes 61A are disposed on the insulating layer 202. The plurality of first MR elements 50A are disposed on the plurality of lower electrodes 61A. The insulating layer 203 is disposed, on the plurality of lower electrodes 61A, around the plurality of first MR elements 50A. The insulating layer 204 is disposed, on the insulating layer 202, around the plurality of lower electrodes 61A and the insulating layer 203. The plurality of upper electrodes 62A are disposed on the plurality of first MR elements 50A and the insulating layer 203. The insulating layer 205 is disposed on the plurality of upper electrodes 62A and the insulating layers 203 and 204. Note that FIG. 7 shows the insulating layer 202 and the plurality of first MR elements 50A among the components of the first chip 2.

The top surface 201*a* of the substrate 201 is parallel to the XY plane. The top surface of each of the plurality of lower electrodes 61A is also parallel to the XY plane. The plurality of first MR elements 50A can therefore be said to be disposed on a flat surface parallel to the XY plane.

As shown in FIG. 7, the plurality of first MR elements 50A are disposed so that two or more first MR elements 50A are arranged both in the X direction and in the Y direction. The plurality of first MR elements 50A are connected in series by the plurality of lower electrodes 61A and the plurality of upper electrodes 62A. Note that, when seen in the Z direction, two first MR elements 50A adjoining in the direction parallel to the X direction may be displaced or not displaced in the direction parallel to the Y direction.

A method for connecting the plurality of first MR elements 50A will now be described in detail with reference to FIG. 11. In FIG. 11, the reference numerals 61 denote lower electrodes corresponding to given MR elements 50, and the reference numerals 62 denote upper electrodes corresponding to the MR elements 50. As shown in FIG. 11, each lower electrode 61 has a long slender shape. Two lower electrodes 61 adjoining in the longitudinal direction of the lower electrodes 61 have a gap therebetween. MR elements 50 are disposed near both longitudinal ends on the top surface of each lower electrode 61. Each upper electrode 62 has a long slender shape, and electrically connects two adjoining MR elements 50 that are disposed on two lower electrodes 61 adjoining in the longitudinal direction of the lower electrodes 61.

Although not shown in the drawings, an MR element 50 located at the end of a row of MR elements 50 is connected to another MR element 50 located at the end of another row of MR elements 50 adjoining in a direction intersecting with the longitudinal direction of the lower electrodes 61. The two MR elements 50 are connected to each other by a not-shown electrode. The not-shown electrode may be an electrode connecting the bottom surfaces of the two MR elements 50 or the top surfaces of the same.

If the MR elements 50 shown in FIG. 11 are first MR elements 50A, the lower electrodes 61 shown in FIG. 11 correspond to lower electrodes 61A, and the upper electrodes 62 shown in FIG. 11 correspond to upper electrodes 62A. In such a case, the longitudinal direction of the lower electrodes 61 is the direction parallel to the Y direction.

Next, a structure of the second chip 3 will be described with reference to FIGS. 9 and 10. FIG. 10 shows a part of a cross section at the position indicated by the line 10-10 in FIG. 9.

The second chip 3 includes a substrate 301 having a top surface 301a, insulating layers 302, 303, 304, 305, 306, and 307, a plurality of lower electrodes 61B, a plurality of lower electrodes 61C, a plurality of upper electrodes 62B, and a plurality of upper electrodes 62C. The top surface 301a of the substrate 301 is parallel to the XY plane. The Z direction is also a direction perpendicular to the top surface 301a of the substrate 301. Note that, since the second chip 3 is a component of the magnetic sensor 1, it can be said that the magnetic sensor 1 includes the substrate 301, the insulating layers 302 to 307, the plurality of lower electrodes 61B, the plurality of lower electrodes 61C, the plurality of upper electrodes 62B, and the plurality of upper electrodes 62C.

The insulating layers 302, 303, and 304 are stacked in this order on the substrate 301. The plurality of lower electrodes 61B and the plurality of lower electrodes 61C are disposed on the insulating layer 304. The plurality of second MR elements 50B are disposed on the plurality of lower electrodes 61B. The plurality of third MR elements 50C are disposed on the plurality of lower electrodes 61C. The insulating layer 305 is disposed, on the plurality of lower electrodes 61B, around the plurality of second MR elements 50B and is disposed, on the plurality of lower electrodes 61C, around the plurality of third MR elements 50C.

The insulating layer 306 is disposed, on the insulating layer 304, around the plurality of lower electrodes 61B, the plurality of lower electrodes 61C, and the insulating layer 305. The plurality of upper electrodes 62B are disposed on the plurality of second MR elements 50B and the insulating layer 305. The plurality of upper electrodes 62C are disposed on the plurality of third MR elements 50C and the insulating layer 305. The insulating layer 307 is disposed on the plurality of upper electrodes 62B, the plurality of upper electrodes 62C, and the insulating layers 305 and 306.

The second chip 3 includes a support member 310 that supports the plurality of second MR elements 50B and the plurality of third MR elements 50C. The support member 310 has at least one inclined surface inclined relative to the top surface 301a of the substrate 301. In particular, in the example embodiment, the support member 310 includes the insulating layers 302, 303, and 304. Note that FIG. 9 shows the support member 310, the plurality of second MR elements 50B, and the plurality of third MR elements 50C among the components of the second chip 3.

The support member 310 includes a plurality of protruding surfaces 310c each protruding in a direction away from the top surface 301a of the substrate 301 (Z direction). The plurality of protruding surfaces 310c each extend in the direction parallel to the X direction. The overall shape of each protruding surface 310c is a semicylindrical curved surface formed by moving the curved shape (arch shape) of the protruding surface 310c shown in FIG. 10 along the direction parallel to the X direction. The plurality of protruding surfaces 310c are arranged at predetermined intervals along the direction parallel to the Y direction.

The plurality of protruding surfaces 310c each have an upper end farthest from the top surface 301a of the substrate 301. In the example embodiment, the upper end of each of the plurality of protruding surfaces 310c extends in the direction parallel to the X direction. Now, focus attention on one of the plurality of protruding surfaces 310c. The protruding surface 310c includes a first inclined surface 310a and a second inclined surface 310b oriented in respective directions different from each other. The first inclined surface 310a refers to a part of the protruding surface 310c on the Y direction side of the upper end of the protruding surface 310c. The second inclined surface 310b refers to a part of the protruding surface 310c on the −Y direction side of the upper end of the protruding surface 310c. In FIG. 9, the border between the first and second inclined surfaces 310a and 310b is shown by a dotted line.

The upper end of the protruding surface 310c may be the border between the first and second inclined surfaces 310a and 310b. In such a case, the dotted line shown in FIG. 9 represents the upper end of the protruding surface 310c.

The top surface 301a of the substrate 301 is parallel to the XY plane. The first and second inclined surfaces 310a and 310b are each inclined relative to the top surface 301a of the substrate 301, i.e., the XY plane. In a cross section perpendicular to the top surface 301a of the substrate 301, the distance between the first and second inclined surfaces 310a and 310b decreases with increasing distance from the top surface 301a of the substrate 301.

In the example embodiment, there are a plurality of protruding surfaces 310c, and thus there are a plurality of first inclined surfaces 310a and a plurality of second inclined surfaces 310b. The support member 310 includes the plurality of first inclined surfaces 310a and the plurality of second inclined surfaces 310b.

The support member 310 further includes a flat surface 310d around the plurality of protruding surfaces 310c. The flat surface 310d is a surface parallel to the top surface 301a of the substrate 301. The plurality of protruding surfaces 310c each protrude from the flat surface 310d in the Z direction. In the example embodiment, the plurality of protruding surfaces 310c are located at predetermined intervals. The flat surface 310d is thus interposed between two protruding surfaces 310c adjoining in the Y direction.

In the example embodiment, the plurality of protruding surfaces 310c and the flat surface 310d are formed substantially by the insulating layer 303. In other words, the insulating layer 303 includes a plurality of protrusions each protruding in the Z direction and a flat portion around the plurality of protrusions. The plurality of protrusions each extend in the direction parallel to the U direction and have a top surface having a shape corresponding to the protruding surface 310c. The plurality of protrusions are arranged at predetermined intervals along the direction parallel to the V direction. The flat portion has a substantially constant thickness (dimension in the Z direction). The insulating layer 304 has a substantially constant thickness (dimension in the Z direction) and is formed along the top surface of the insulating layer 303. The top surface of the insulating layer 304 thus forms the plurality of protruding surfaces 310c and the flat surface 310d.

The insulating layer 302 has a substantially constant thickness (dimension in the Z direction) and is formed along the bottom surface of the insulating layer 303.

The plurality of lower electrodes 61B are disposed on the plurality of first inclined surfaces 310a. The plurality of lower electrodes 61C are disposed on the plurality of second inclined surfaces 310b. As describe above, the first and second inclined surfaces 310a and 310b are each inclined relative to the top surface 301a of the substrate 301, i.e., the XY plane. The top surface of each of the plurality of lower electrodes 61B and the top surface of each of the plurality of lower electrode 61C are thus also inclined relative to the XY plane. Thus, it can be said that the plurality of second MR elements 50B and the plurality of third MR elements 50C are disposed on inclined surfaces inclined relative to the XY plane. The support member 310 is a member for supporting each of the plurality of second MR elements 50B and the plurality of third MR elements 50C to incline relative to the XY plane.

Note that, in the present example embodiment, the first inclined surfaces 310a are curved surfaces. The second MR elements 50B are thus curved along the curved surfaces (first inclined surfaces 310a). For the sake of convenience, in the present example embodiment, the magnetization directions of the magnetization pinned layers 51 of the second MR elements 50B are defined as straight directions as described above. The U direction and the –U direction that are the magnetization directions of the magnetization pinned layers 51 of the second MR elements 50B are also directions in which the tangents to the first inclined surfaces 310a at the vicinity of the second MR elements 50B extend.

Similarly, in the example embodiment, the second inclined surfaces 310b are curved surfaces. The third MR elements 50C are thus curved along the curved surfaces (second inclined surfaces 310b). For the sake of convenience, in the present example embodiment, the magnetization directions of the magnetization pinned layers 51 of the third MR elements 50C are defined as straight directions as described above. The V direction and the –V direction that are the magnetization directions of the magnetization pinned layers 51 of the third MR elements 50C are also directions in which the tangents to the second inclined surfaces 310b at the vicinity of the third MR elements 50C extend.

As shown in FIG. 9, the plurality of second MR elements 50B are disposed so that two or more second MR elements 50B are arranged both in the X direction and in the Y direction. Two or more second MR elements 50B are arranged in a row on one first inclined surface 310a. Similarly, the plurality of third MR elements 50C are disposed so that two or more third MR elements 50C are arranged both in the X direction and in the Y direction. Two or more third MR elements 50C are arranged in a row on one second inclined surface 310b. In the example embodiment, a plurality of rows of second MR elements 50B and a plurality of rows of third MR elements 50C are alternately arranged in the direction parallel to the Y direction.

Note that, when seen in the Z direction, a second MR element 50B and a third MR element 50C adjoining each other may be displaced or not displaced in the direction parallel to the X direction. When seen in the Z direction, two second MR elements 50B adjoining with a third MR element 50C therebetween may be displaced or not displaced in the direction parallel to the X direction. When seen in the Z direction, two third MR elements 50C adjoining with a second MR element 50B therebetween may be displaced or not displaced in the direction parallel to the X direction.

The plurality of second MR elements 50B are connected in series by the plurality of lower electrodes 61B and the plurality of upper electrodes 62B. The foregoing description of the method for connecting the plurality of first MR elements 50A also applies to a method for connecting the plurality of second MR elements 50B. If the MR elements 50 shown in FIG. 11 are second MR elements 50B, the lower electrodes 61 shown in FIG. 11 correspond to lower electrodes 61B, and the upper electrode 62 shown in FIG. 11 correspond to upper electrodes 62B. In such a case, the longitudinal direction of the lower electrodes 61 is the direction parallel to the X direction.

Similarly, the plurality of third MR elements 50C are connected in series by the plurality of lower electrodes 61C and the plurality of upper electrodes 62C. The foregoing description of the method for connecting the plurality of first MR elements 50A also applies to a method for connecting the plurality of third MR elements 50C. If the MR elements 50 shown in FIG. 11 are third MR elements 50C, the lower electrodes 61 shown in FIG. 11 correspond to lower electrodes 61C, and the upper electrodes 62 shown in FIG. 11 correspond to upper electrodes 62C. In such a case, the longitudinal direction of the lower electrodes 61 is the direction parallel to the X direction.

Next, the first to third detection signals will be described. The first detection signal will initially be described with reference to FIG. 4. As the strength of the component of the target magnetic field in the direction parallel to the X direction changes, the resistance of each of the resistor sections R11 to R14 of the first detection circuit 10 changes either so that the resistances of the resistor sections R11 and R13 increase and the resistances of the resistor sections R12 and R14 decrease or so that the resistances of the resistor sections R11 and R13 decrease and the resistances of the resistor sections R12 and R14 increase. Thereby the electric potential of each of the signal output ports E11 and E12 changes. The first detection circuit 10 is configured to generate a signal corresponding to the electric potential of the signal output port E11 as a first detection signal S11, and generate a signal corresponding to the electric potential of the signal output port E12 as a first detection signal S12.

Next, the second detection signal will be described with reference to FIG. 5. As the strength of the component of the target magnetic field in the direction parallel to the U direction changes, the resistance of each of the resistor sections R21 to R24 of the second detection circuit 20 changes either so that the resistances of the resistor sections R21 and R23 increase and the resistances of the resistor sections R22 and R24 decrease or so that the resistances of the resistor sections R21 and R23 decrease and the resistances of the resistor sections R22 and R24 increase. Thereby the electric potential of each of the signal output ports E21 and E22 changes. The second detection circuit 20 is configured to generate a signal corresponding to the electric potential of the signal output port E21 as a second detection signal S21, and generate a signal corresponding to the electric potential of the signal output port E22 as a second detection signal S22.

Next, the third detection signal will be described with reference to FIG. 6. As the strength of the component of the target magnetic field in the direction parallel to the V direction changes, the resistance of each of the resistor sections R31 to R34 of the third detection circuit 30 changes either so that the resistances of the resistor sections R31 and R33 increase and the resistances of the resistor sections R32 and R34 decrease or so that the resistances of the resistor sections R31 and R33 decrease and the resistances of the resistor sections R32 and R34 increase. Thereby the electric potential of each of the signal output ports E31 and E32 changes. The third detection circuit 30 is configured to generate a signal corresponding to the electric potential of the signal output port E31 as a third detection signal S31, and generate a signal corresponding to the electric potential of the signal output port E32 as a third detection signal S32.

Next, an operation of the processor 40 will be described. The processor 40 is configured to generate the first detection value based on the first detection signals S11 and S12. The first detection value is a detection value corresponding to the component of the target magnetic field in the direction parallel to the X direction. The first detection value will hereinafter be represented by the symbol Sx.

In the present example embodiment, the processor 40 generates the first detection value Sx by an arithmetic including obtainment of the difference S11-S12 between the first detection signal S11 and the first detection signal S12. The first detection value Sx may be the difference S11-S12 itself. The first detection value Sx may be a result of predetermined correction, such as gain adjustment or offset adjustment, made to the difference S11-S12.

The processor 40 is further configured to generate the second and third detection values based on the second detection signals S21 and S22 and the third detection signals S31 and S32. The second detection value is a detection value corresponding to the component of the target magnetic field in the direction parallel to the Y direction. The third detection value is a detection value corresponding to the component of the target magnetic field in the direction parallel to the Z direction. The second detection value will hereinafter be represented by the symbol Sy, and the third detection value will be represented by the symbol Sz.

The processor 40 generates the second and third detection values Sy and Sz as follows, for example. First, the processor 40 generates a value S1 by an arithmetic including obtainment of the difference S21-S22 between the second detection signal S21 and the second detection signal S22, and generates a value S2 by an arithmetic including obtainment of the difference S31-S32 between the third detection signal S31 and the third detection signal S32. Next, the processor 40 calculates values S3 and S4 using the following expressions (1) and (2).

$$S3 = (S2 + S1)/(2\cos\alpha) \tag{1}$$
$$S4 = (S2 - S1)/(2\sin\alpha) \tag{2}$$

The second detection value Sy may be the value S3 itself. The second detection value Sy may be a result of predetermined correction, such as gain adjustment or offset adjustment, made to the value S3. Similarly, the third detection value Sz may be the value S4 itself. The third detection value Sz may be a result of predetermined correction, such as gain adjustment or offset adjustment, made to the value S4.

Figure 12:
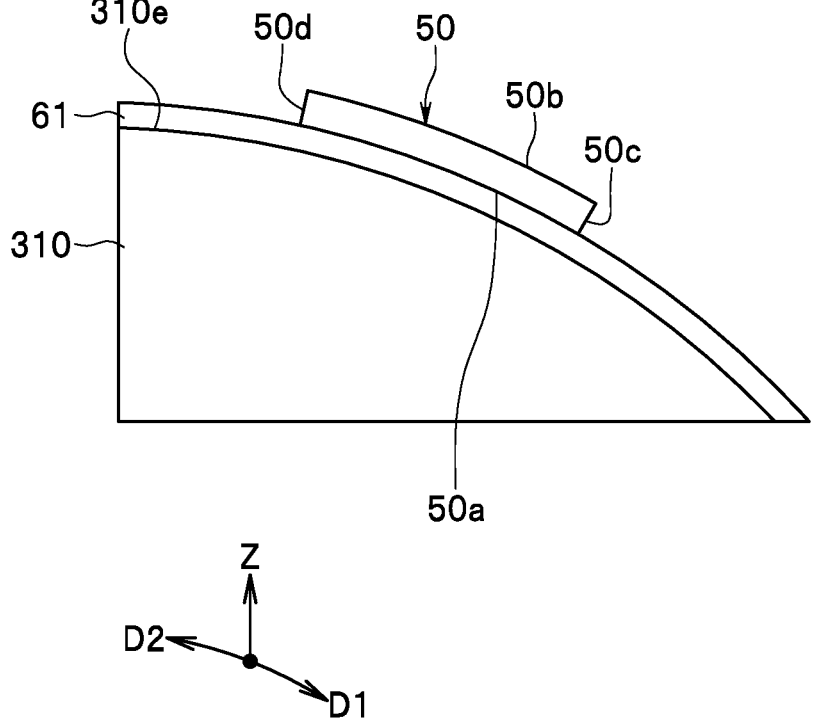
FIG. 12 is a sectional view showing the magnetoresistive element, a lower electrode, and a support member of the first example embodiment of the technology.
Figure 13:
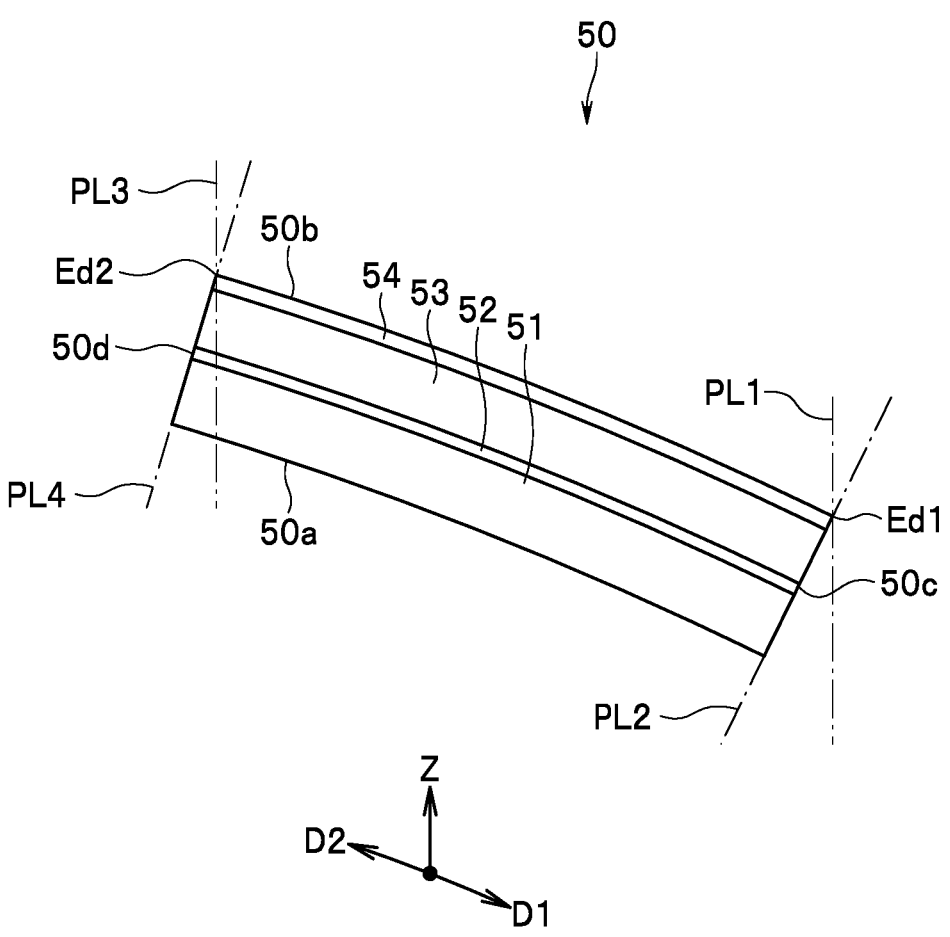
FIG. 13 is a sectional view showing the magnetoresistive element shown in FIG. 12.

Next, structural features of the magnetic sensor 1 will be described with reference to FIGS. 12 and 13. FIG. 12 is a sectional view showing an MR element 50, a lower electrode 61, and the support member 310. FIG. 13 is a sectional view showing the MR element 50 shown in FIG. 12.

FIG. 12 shows a cross section that intersects with an MR element 50 disposed on any given inclined surface 310e and that is parallel to a YZ plane. The cross section parallel to the YZ plane is hereinafter referred to as a YZ cross section. The YZ cross section shown in FIG. 12 may be, similarly to FIG. 10, a YZ cross section that a cross section of the MR element 50 is seen from a position at a distance in the X direction. In such a case, the MR element 50, the lower electrode 61, and the inclined surface 310e correspond to the second MR element 50B, the lower electrode 61B, and the first inclined surface 310a, respectively. Alternatively, the YZ cross section shown in FIG. 12 may be a YZ cross section that a cross section of the MR element 50 is seen from a position at a distance in the −X direction. In such a case, the MR element 50, the lower electrode 61, and the inclined surface 310e correspond to the third MR element 50C, the lower electrode 61C, and the second inclined surface 310b, respectively.

Here, as shown in FIGS. 12 and 13, a first direction D1 and a second direction D2 that are parallel to the YZ plane are defined. The first direction D1 is a direction that is along the inclined surface 310e and that gets close to the reference plane. In the present example embodiment, the top surface 301a of the substrate 301 (see FIG. 10) is assumed to be the reference plane. The Z direction is a direction perpendicular to the reference plane (the top surface 301a of the substrate 301). The second direction D2 is a direction that is along the inclined surface 310e and that gets away from the reference plane (the top surface 301a of the substrate 301).

The MR element 50 has a bottom surface 50a facing the inclined surface 310e, a top surface 50b located opposite to the bottom surface 50a, a first side surface 50c, and a second side surface 50d. The first side surface 50c and the second side surface 50d are located at both short direction ends of the MR element 50. The first side surface 50c is, as compared to the second side surface 50d, located in front in the first direction D1 and connects the end of the bottom surface 50a in the first direction D1 and the end of the top surface 50b in the first direction D1. The second side surface 50d is, as compared to the first side surface 50c, located in front in the second direction D2 and connects the end of the bottom surface 50a in the second direction D2 and the end of the top surface 50b in the second direction D2.

An angle that a part of the inclined surface 310e facing the MR element 50 forms with respect to the reference plane (the top surface 301a of the substrate 301) is in the range of 10° to 50°, for example. In particular, in the example embodiment, the inclined surface 310e is a curved surface. In such a case, the angle described above varies in the range described above. Note that, in a case where the inclined surface 310e is a flat surface, the angle described above is a certain angle in the range described above.

In FIG. 13, the reference numeral PL1 denotes a first virtual plane that intersects with a first corner Ed1 present at a position at where the top surface 50b and the first side surface 50c intersect and that is perpendicular to the reference plane (the top surface 301a of the substrate 301). The reference numeral PL2 denotes a second virtual plane that intersects with the first corner Ed1 and that is perpendicular to the inclined surface 310e. The reference numeral PL3 denotes a third virtual plane that intersects with a second corner Ed2 present at a position at where the top surface 50b and the second side surface 50d intersect and that is perpendicular to the reference plane (the top surface 301a of the substrate 301). The reference numeral PL4 denotes a fourth virtual plane that intersects with the second corner Ed2 and that is perpendicular to the inclined surface 310e.

At least a part of the first side surface 50c is, as compared to the first virtual plane PL1, located close to the second side surface 50d. As shown in FIG. 13, in particular, in the example embodiment, the whole of the first side surface 50c is, as compared to the first virtual plane PL1, located close to the second side surface 50d.

In the example shown in FIG. 13, an angle that the first side surface 50c forms with respect to the second virtual plane PL2 is 0° or substantially 0°. In other words, in the example shown in FIG. 13, the first side surface 50c is perpendicular or substantially perpendicular to the inclined surface 310e at a part near the first side surface 50c. Note that the first side surface 50c may be inclined relative to the second virtual plane PL2. The angle that the first side surface 50c forms with respect to the second virtual plane PL2 may be in the range of 0° to 20°.

Note that the inclined angle of the first side surface 50c may be expressed as the angle that the first side surface 50c forms with respect to the second virtual plane PL2 as described above or may be expressed as an angle that the first side surface 50c forms with respect to a virtual plane tangent to the inclined surface 310e at a part near the first side surface 50c. When the former angle is in the range of 0° to 20°, the latter angle is in the range of 70° to 90°.

At least a part of the second side surface 50d is, as compared to the third virtual plane PL3, located far from the first side surface 50c. As shown in FIG. 13, in particular, in the example embodiment, the whole of the second side surface 50d is, as compared to the third virtual plane PL3, located far from the first side surface 50c.

In the example shown in FIG. 13, an angle that the second side surface 50d forms with respect to the fourth virtual plane PL4 is 0° or substantially 0°. In other words, in the example shown in FIG. 13, the second side surface 50d is perpendicular or substantially perpendicular to the inclined surface 310e at a part near the second side surface 50d. Note that the second side surface 50d may be inclined relative to the fourth virtual plane PL4. The angle that the second side surface 50d forms with respect to the fourth virtual plane PL4 may be in the range of 0° to 20°.

Note that the inclined angle of the second side surface 50d may be expressed as the angle that the second side surface 50d forms with respect to the fourth virtual plane PL4 as described above or may be expressed as an angle that the second side surface 50d forms with respect to a virtual plane tangent to the inclined surface 310e at a part near the second side surface 50d. When the former angle is in the range of 0° to 20°, the latter angle is in the range of 70° to 90°.

The first side surface 50c and the second side surface 50d are preferably substantially parallel to each other. In other words, an angle formed by the first side surface 50c and the second side surface 50d is preferably small at a certain extent. The angle formed by the first side surface 50c and the second side surface 50d is preferably smaller than an angle that the second side surface 50d forms with respect to the third virtual plane PL3, for example.

Next, a manufacturing method for the magnetic sensor 1 according to the example embodiment will be described. The manufacturing method for the magnetic sensor 1 includes a step of manufacturing the first chip 2 and a step of manufacturing the second chip 3.

First, the step of manufacturing the first chip 2 will be described briefly with reference to FIG. 8. In the step of manufacturing the first chip 2, first, the insulating layer 202 is formed on the substrate 201. A metal film is then formed on the insulating layer 202. The plurality of first MR elements 50A are then formed on the metal film. The insulating layer 203 is then formed around the plurality of first MR elements 50A. The metal film and the insulating layer 203 are then etched so that the metal film serves as the plurality of lower electrodes 61A. The insulating layer 204 is then formed around the plurality of lower electrode 61A and the insulating layer 203. The plurality of upper electrodes 62A are then formed on the plurality of first MR elements 50A and the insulating layer 203. The insulating layer 205 is then formed on the plurality of upper electrodes 62A and the insulating layers 203 and 204. A process such as forming a plurality of terminals corresponding to the power supply port V1, the ground port G1, and the signal output ports E11 and E12 are then performed to complete the first chip 2.

Next, the step of manufacturing the second chip 3 will be described with reference to FIGS. 14 to 26. FIGS. 14 to 26 each show a cross section of a stack in the process of manufacturing the second chip 3.

Figure 14:
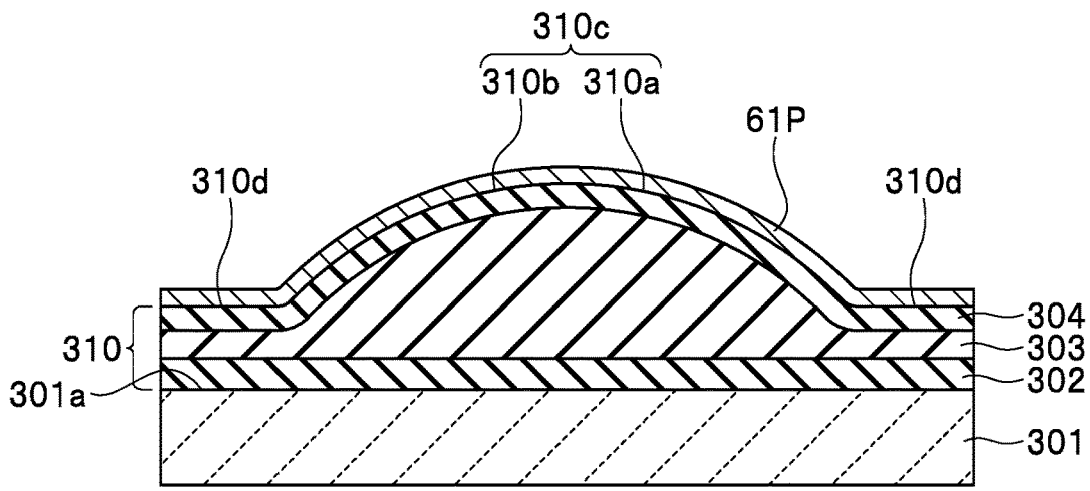
FIG. 14 is a sectional view showing a step in a manufacturing method for the magnetic sensor according to the first example embodiment of the technology.
Figure 14:
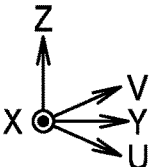

As shown in FIG. 14, in the step of manufacturing the second chip 3, first, the insulating layers 302 and 303 are formed in this order on the substrate 301. A plurality of etching masks are then formed on the insulating layer 303. The plurality of etching masks have a shape corresponding to the plurality of protruding surfaces 310c of the support member 310 to be formed later. The insulating layer 303 and the plurality of etching masks are then etched to remove the plurality of etching masks. A plurality of protruding surfaces corresponding to the plurality of protruding surfaces 310c are thereby formed on the insulating layer 303.

The insulating layer 304 is then formed on the insulating layer 303. The support member 310 is thereby completed. A metal film 61P is then formed on the insulating layer 304.

Figure 15:
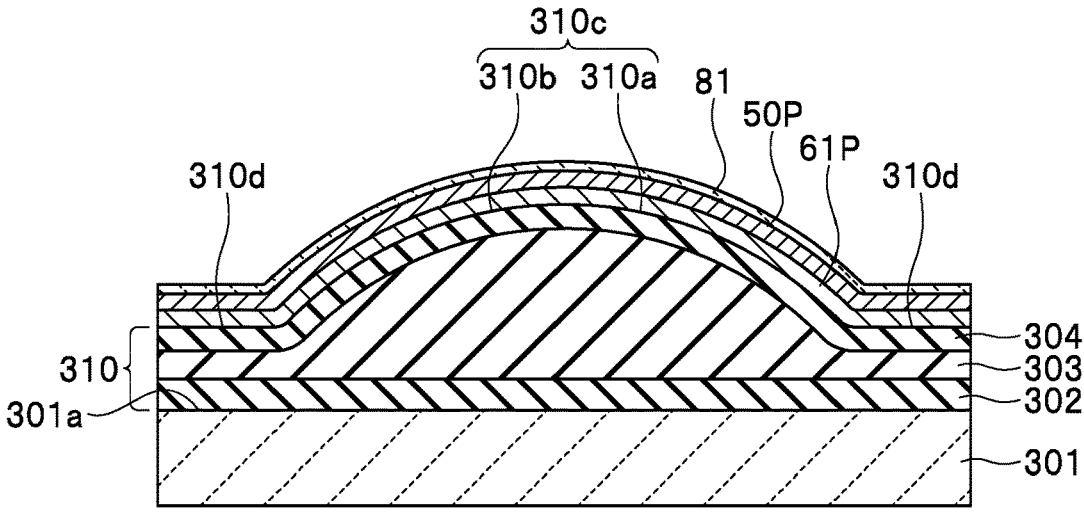
FIG. 15 is a sectional view showing a step that follows the step shown in FIG. 14.
Figure 15:
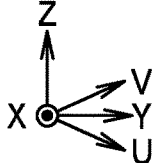

FIG. 15 shows the next step. In this step, first, a layered film 50P to serve as the plurality of second MR elements 50B and the plurality of third MR elements 50C later is formed on the metal film 61P. The layered film 50P includes all the layers to constitute the plurality of second MR elements 50B and the plurality of third MR elements 50C. The all the layers include a plurality of magnetic layers to constitute the magnetization pinned layer 51 and the free layer 53. The layered film 50P is formed on the first inclined surface 310a, the second inclined surface 310b, and the flat surface 310d of the support member 310.

A protective layer 81 is then formed on the layered film 50P. The protective layer 81 is what is called a hard mask, and is formed of an inorganic material. As the inorganic material to form the protective layer 81, carbon or alumina is used, for example. The protective layer 81 has a thickness in the range of 15 to 20 nm, for example.

Figure 16:
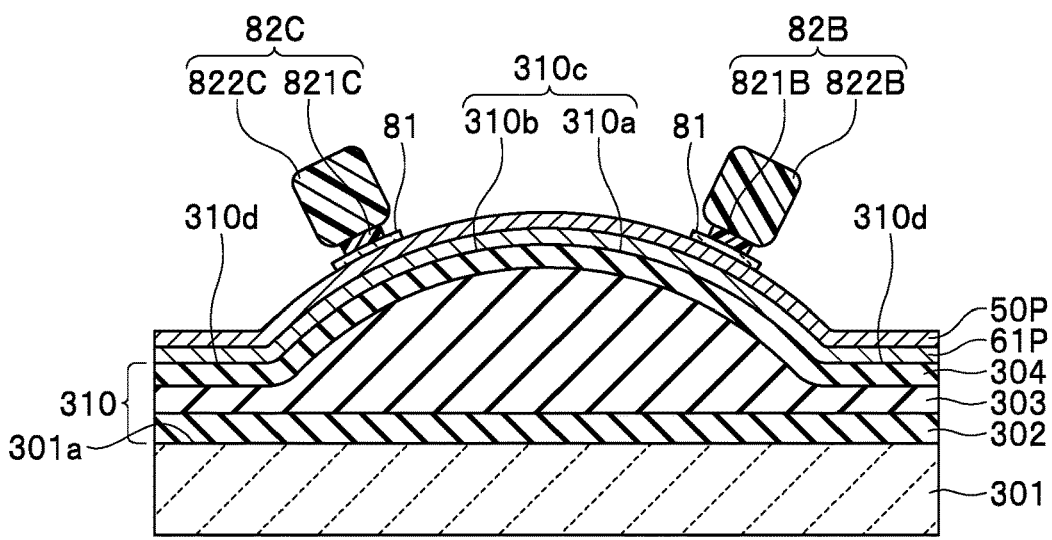
FIG. 16 is a sectional view showing a step that follows the step shown in FIG. 15.
Figure 16:
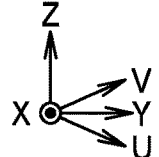

FIG. 16 shows the next step. In this step, first, a plurality of masks 82B and a plurality of masks 82C are formed. The plurality of masks 82B have a shape corresponding to the plurality of second MR elements 50B. The plurality of masks 82C have a shape corresponding to the plurality of third MR elements 50C.

The plurality of masks 82B each include a lower layer 821B lying on the protective layer 81 and an upper layer 822B lying on the lower layer 821B. The plurality of masks 82C each include a lower layer 821C lying on the protective layer 81 and an upper layer 822C lying on the lower layer 821C. The upper layers 822B and 822C are each formed of a photoresist patterned by photolithography. The lower layers 821B and 821C are each formed of, for example, a material that dissolves in a developing solution used in patterning the upper layers 822B and 822C.

In the step shown in FIG. 16, a first etching step is then performed. The first etching step is a step of etching a part of the protective layer 81 by using the plurality of masks 82B and the plurality of masks 82C. The first etching step is performed by using reactive ion etching (hereinafter, referred to as RIE). The first etching step removes a portion of the protective layer 81 not covered with the plurality of masks 82B nor the plurality of masks 82C.

Figure 17:
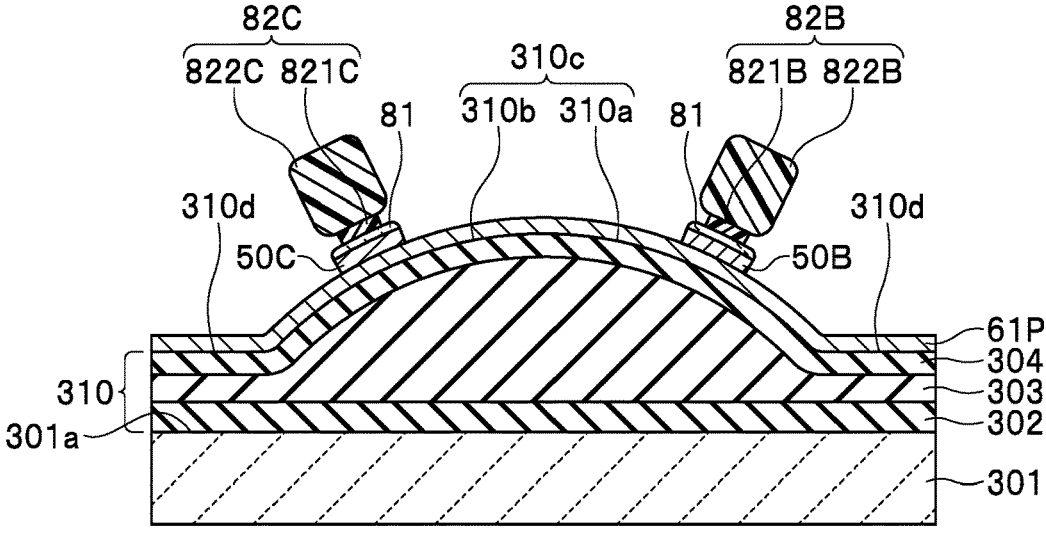
FIG. 17 is a sectional view showing a step that follows the step shown in FIG. 16.
Figure 17:
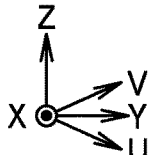

FIG. 17 shows the next step. In this step, a second etching step is performed. The second etching step is a step of etching a part of the layered film 50P by using, as etching masks, the plurality of masks 82B, the plurality of masks 82C, and the protective layer 81. The second etching step is performed by using ion beam etching (hereinafter, referred to as IBE). In the second etching step, the layered film 50P is etched so that the layered film 50P serves as the plurality of second MR elements 50B and the plurality of third MR elements 50C. In particular, in the second etching step, the direction of travel of the ion beam is tilted with respect to a direction perpendicular to the top surface 301*a* of the substrate 301, so that the first and second side surfaces 50*c* and 50*d* of each of the plurality of second MR elements 50B and the first and second side surfaces 50*c* and 50*d* of each of the plurality of third MR elements 50C are formed in the layered film 50P. The direction of travel of the ion beam may be tilted to a direction parallel to the top surface 301*a* of the substrate 301 or a direction close to parallel to the top surface 301*a* of the substrate 301, for example.

Figure 18:
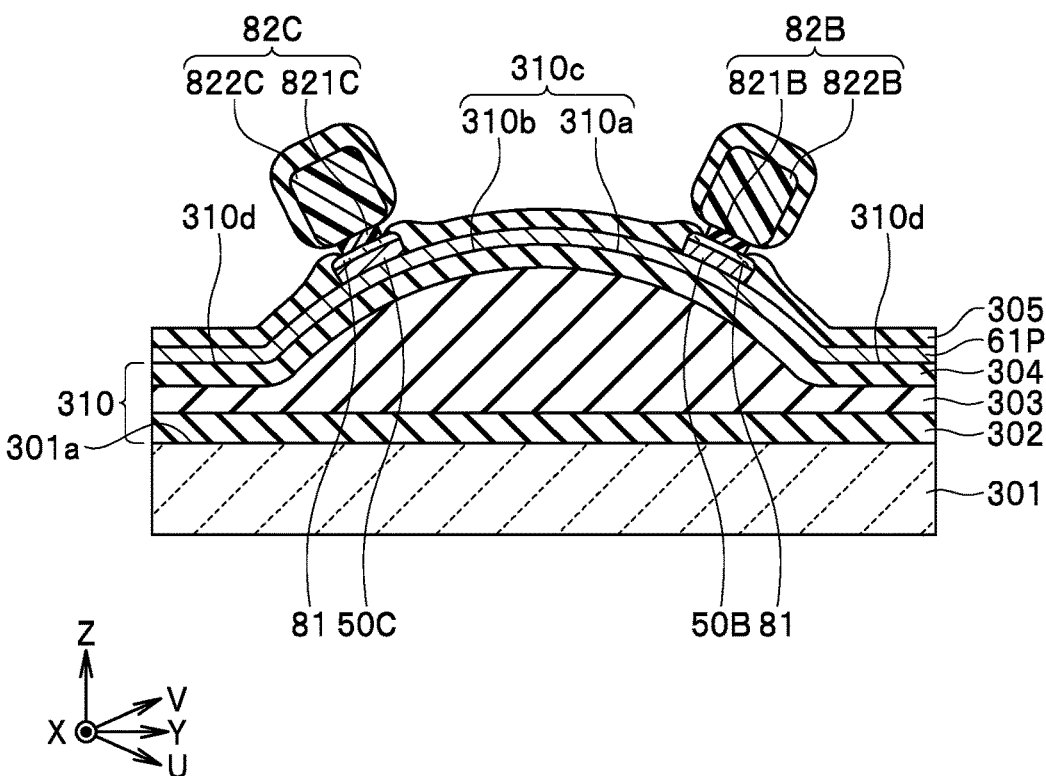
FIG. 18 is a sectional view showing a step that follows the step shown in FIG. 17.
Figure 19:
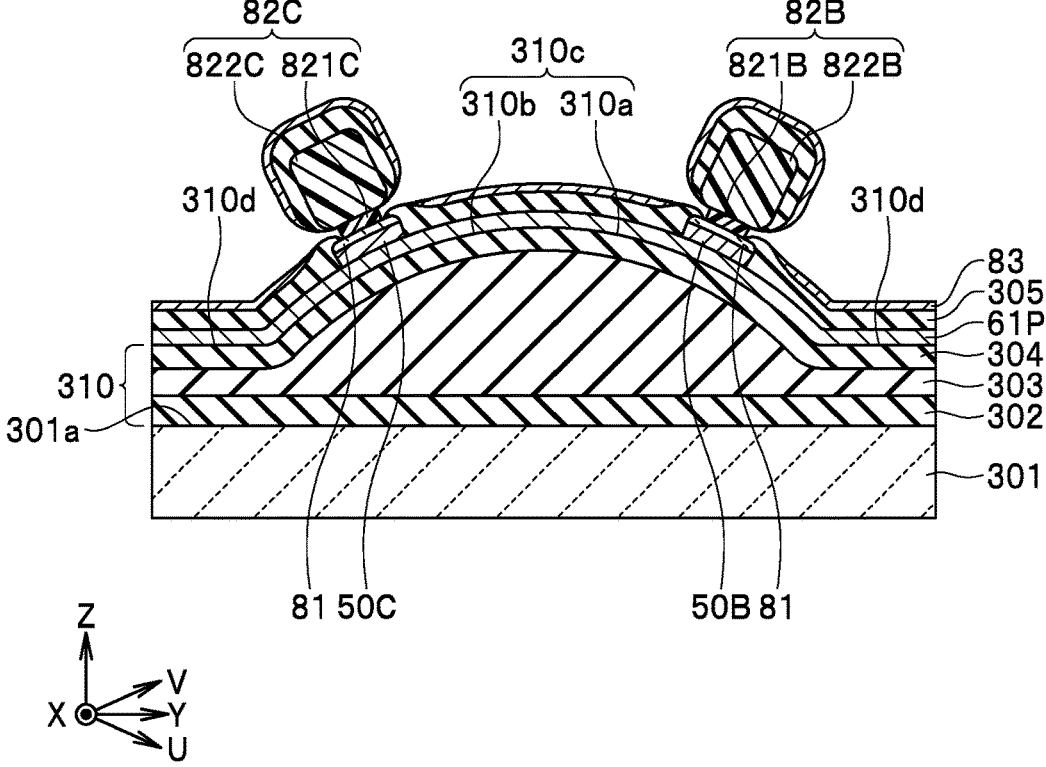
FIG. 19 is a sectional view showing a step that follows the step shown in FIG. 18.
Figure 20:
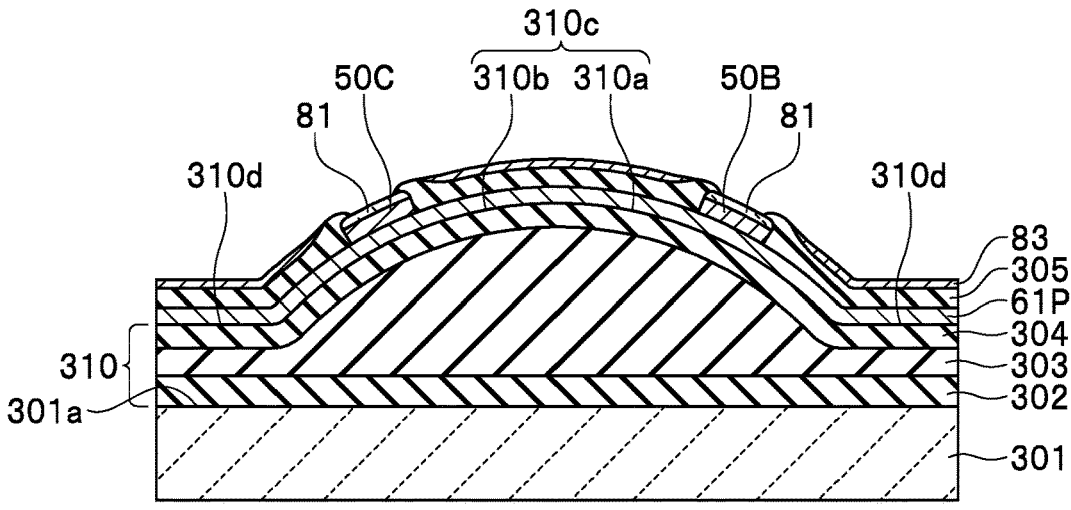
FIG. 20 is a sectional view showing a step that follows the step shown in FIG. 19.
Figure 20:
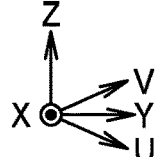

FIG. 18 shows the next step. In this step, the insulating layer 305 is formed over the entire top surface of the stack, with the plurality of masks 82B and the plurality of masks 82C left unremoved. As shown in FIG. 19, a nonmagnetic metal layer 83 of Ru, for example, is then formed over the entire top surface of the stack. As shown in FIG. 20, the plurality of masks 82B and the plurality of masks 82C are then lifted off.

Figure 21:
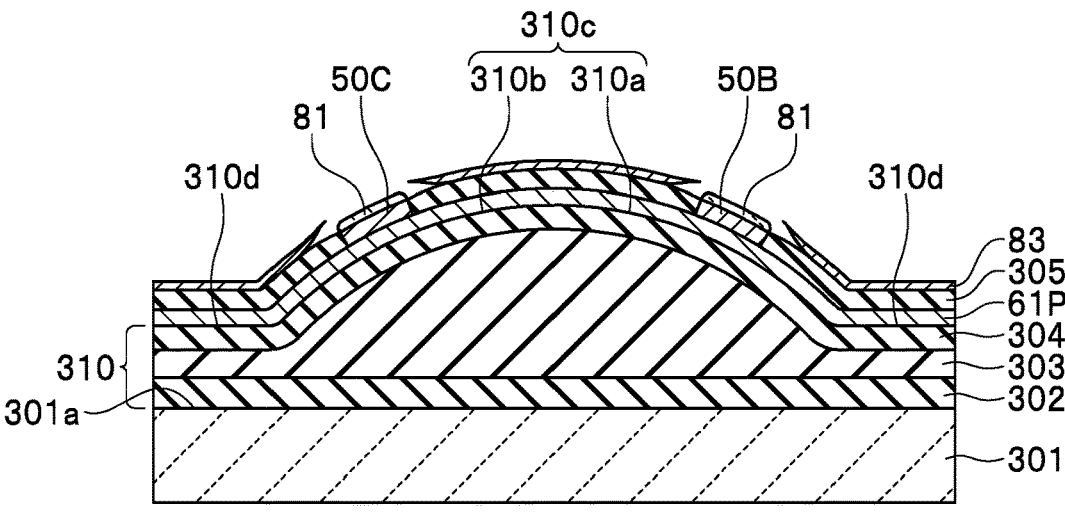
FIG. 21 is a sectional view showing a step that follows the step shown in FIG. 20.
Figure 21:
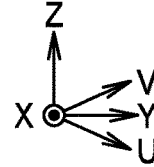

FIG. 21 shows the next step. In this step, of the insulating layer 305, portions stranded on the protective layer 81 are removed by wet etching, for example.

Figure 22:
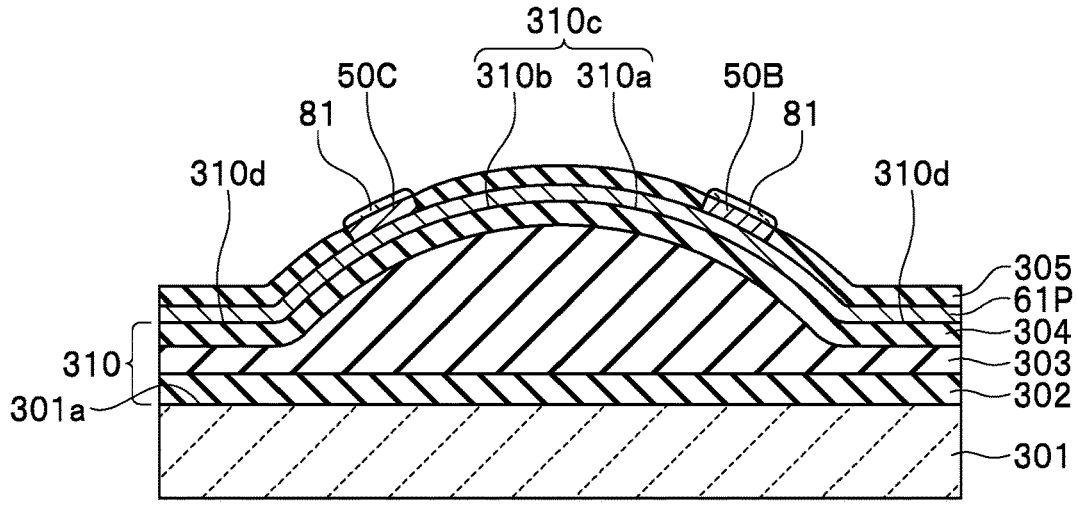
FIG. 22 is a sectional view showing a step that follows the step shown in FIG. 21.
Figure 22:
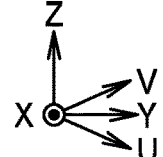

FIG. 22 shows the next step. In this step, the nonmagnetic metal layer 83 is removed by dry etching such as RIE or IBE, for example.

Figure 23:
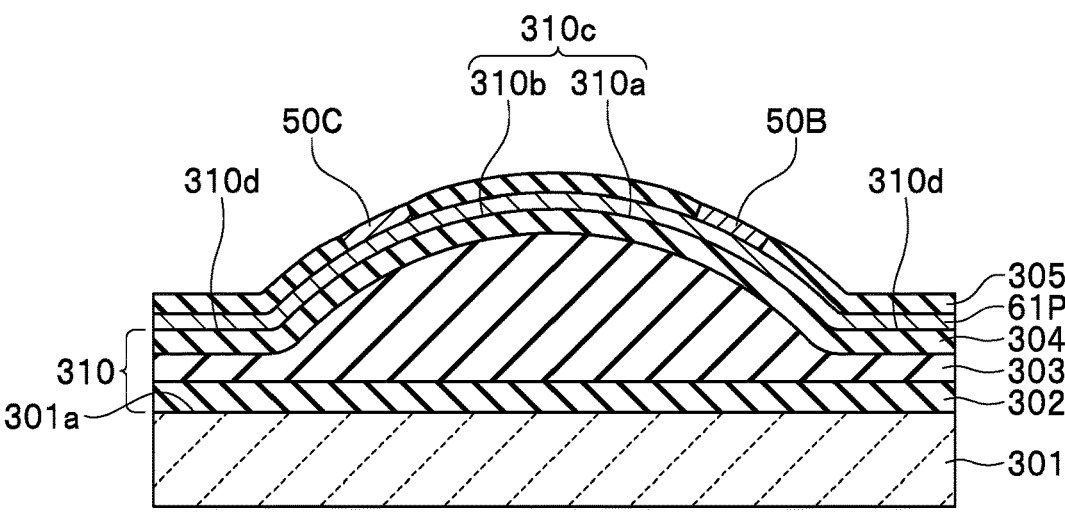
FIG. 23 is a sectional view showing a step that follows the step shown in FIG. 22.
Figure 23:
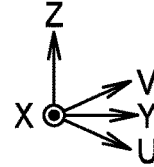

FIG. 23 shows the next step. In this step, the protective layer 81 is removed. In the case where the protective layer 81 is of carbon, the protective layer 81 is removed by ashing, for example. In the case where the protective layer 81 is of alumina, the protective layer 81 is removed by wet etching, for example.

Figure 24:
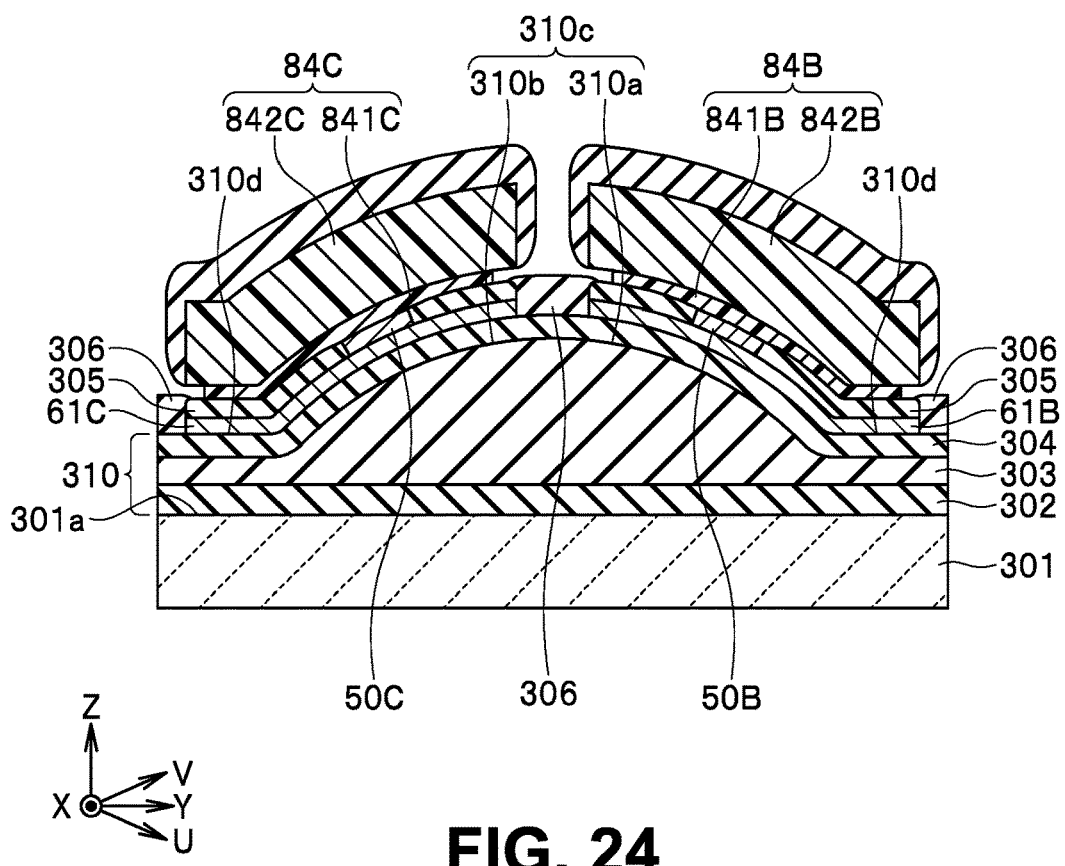
FIG. 24 is a sectional view showing a step that follows the step shown in FIG. 23.

FIG. 24 shows the next step. In this step, first, a plurality of masks 84B and a plurality of masks 84C are formed. The plurality of masks 84B have a shape corresponding to the plurality of lower electrodes 61B. The plurality of masks 82C have a shape corresponding to the plurality of lower electrodes 61C.

The plurality of masks 84B each include a lower layer 841B lying on the plurality of second MR elements 50B and the insulating layer 305 and an upper layer 842B lying on the lower layer 841B. The plurality of masks 84C each include a lower layer 841C lying on the plurality of third MR elements 50C and the insulating layer 305 and an upper layer 842C lying on the lower layer 841C. The upper layers 842B and 842C are formed of the same material as the upper layers 822B and 822C. The lower layers 841B and 841C are formed of the same material as the lower layers 821B and 821C.

Figure 25:
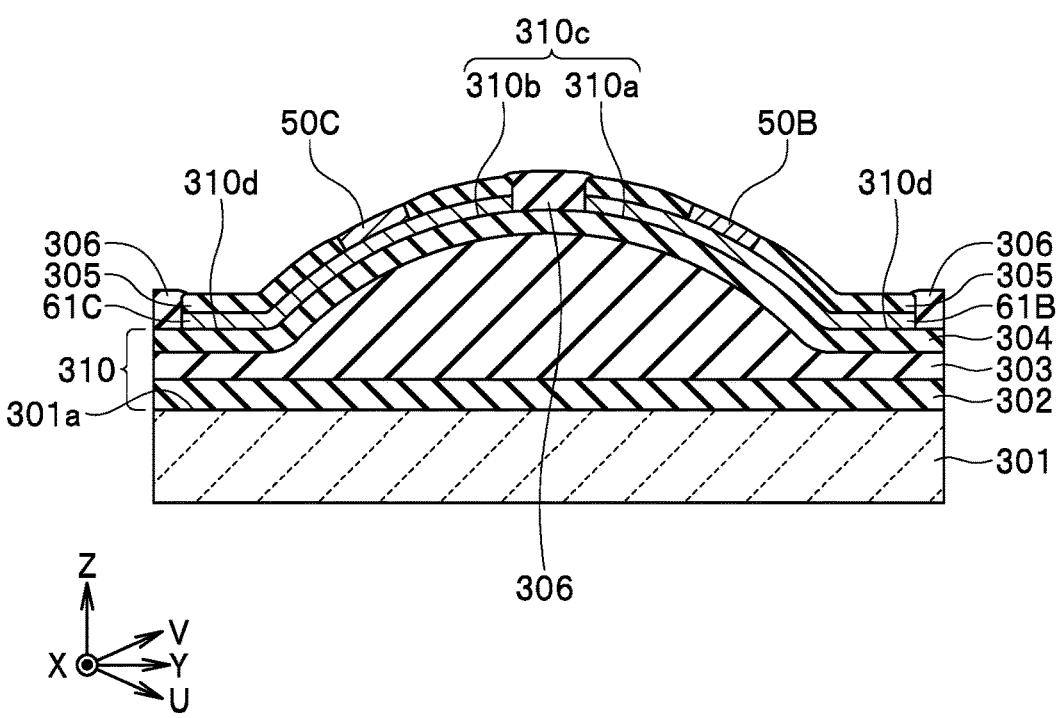
FIG. 25 is a sectional view showing a step that follows the step shown in FIG. 24.

In the step shown in FIG. 24, the metal film 61P and the insulating layer 305 are then etched by using the plurality of masks 84B and the plurality of masks 84C, by IBE, for example. In the etching, the metal film 61P is etched so that the metal film 61P serves as the plurality of lower electrodes 61B and the plurality of lower electrodes 61C. The insulating layer 306 is then formed over the entire top surface of the stack, with the plurality of masks 84B and the plurality of masks 84C left unremoved. As shown in FIG. 25, the plurality of masks 84B and the plurality of masks 84C are then lifted off.

Figure 26:
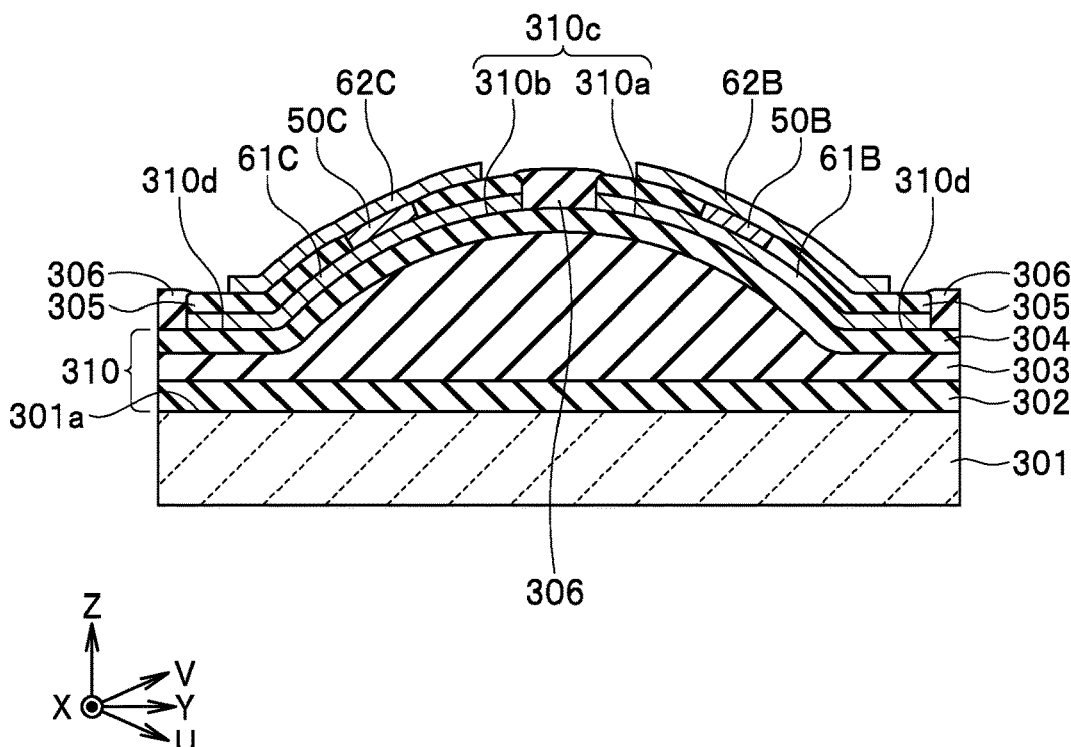
FIG. 26 is a sectional view showing a step that follows the step shown in FIG. 25.

FIG. 26 shows the next step. In this step, first, the plurality of upper electrodes 62B are formed on the plurality of second MR elements 50B and the insulating layer 305, and the plurality of upper electrodes 62C are formed on the plurality of third MR elements 50C and the insulating layer 305. The insulating layer 307 (see FIG. 10) is then formed on the plurality of upper electrodes 62B, the plurality of upper electrodes 62C and the insulating layers 305 and 306. A process such as forming a plurality of terminals corresponding to the power supply ports V2 and V3, the ground ports G2 and G3, and the signal output ports E21, E22, E31, and E32 are then performed to complete the second chip 3.

As described above, the manufacturing method for the magnetic sensor 1 according to the example embodiment includes a step of forming the support member 310 on the substrate 301 and a step of forming the plurality of MR elements 50. The step of forming the plurality of MR elements 50 includes a step of forming the layered film 50P on the first and second inclined surfaces 310*a* and 310*b* of the support member 310, a step of forming the protective layer 81 on the layered film 50P, a step of forming the plurality of masks 82B and the plurality of masks 82C, a first etching step of etching a part of the protective layer 81 by using the plurality of masks 82B and the plurality of masks 82C, and a second etching step of etching the layered film 50P by using the plurality of masks 82B, the plurality of masks 82C, and the etched protective layer 81, so that the layered film 50P serves as the plurality of second MR elements 50B and the plurality of third MR elements 50C. In particular, in the example embodiment, the plurality of second MR elements 50B and the plurality of third MR elements 50C are formed at the same time in the second etching step.

The step of forming the plurality of MR elements 50 further includes a step of forming the insulating layer 305 after the second etching step, and a step of removing the protective layer 81 after the step of forming the insulating layer 305.

According to the example embodiment, as compared to a comparative example manufacturing method of etching the layered film 50P by using no protective film 81, the first and second side surfaces 50*c* and 50*d* of each of the MR elements 50 (second MR elements 50B and third MR elements 50C) can have a small taper. Specifically, in the comparative example manufacturing method, the layered film 50P is etched with gaps between the layered film 50P and the plurality of masks 82B and the plurality of masks 82C. In the comparative example manufacturing method, in order to prevent the top surface and the vicinity of the layered film 50P from being etched to damage the free layer 53, the direction of travel of the ion beam is directed perpendicular or substantially perpendicular to the top surface 301*a* of the substrate 301 to etch the layered film 50P. In such a case, the direction of travel of the ion beam is tilted with respect to a direction perpendicular to the inclined surface 310*e* (first inclined surface 310*a* and second inclined surface 310*b*) of the support member 310. As a result, the first and second side surfaces 50*c* and 50*d* of each MR element 50 is tapered, tilting with respect to the direction perpendicular to the inclined surface 310*e* of the support member 310.

In contrast, in the example embodiment, the layered film 50P is covered with the protective layer 81. Thus, in the example embodiment, in etching of the layered film 50P, with the protective layer 81, the top surface and the vicinity of the layered film 50P can be prevented from being etched. With this, as described above, the example embodiment allows the layered film 50P to be etched with the direction of travel of the ion beam being tilted with respect to the direction perpendicular to the top surface 301*a* of the substrate 301. Thus, according to the example embodiment, a part of the layered film 50P closer to the inclined surface 310e of the support member 310 can be etched, while preventing the top surface and the vicinity of the layered film 50P from being etched. With this, the example embodiment allows the taper of the first and second side surfaces 50c and 50d of the MR element 50 to be made small.

As described above, the example embodiment allows the taper of the first and second side surfaces 50c and 50d of the MR element 50 to be made small. In particular, in the example embodiment, the first side surface 50c is, as compared to the first virtual plane PL1 perpendicular to the reference plane (the top surface 301a of the substrate 301), located close to the second side surface 50d. This feature means that the first side surface 50c is made closer to the second virtual plane PL2 perpendicular to the inclined surface 310e, resulting in a small taper of the first side surface 50c.

Meanwhile, assuming the same size of the top surface 50b of the MR element 50, the greater the taper of the first and second side surfaces 50c and 50d of the MR element 50, the smaller the shape magnetic anisotropy of the free layer 53. When the width of the MR element 50 is decreased in order to increase the shape magnetic anisotropy of the free layer 53, the sensitivity of the MR element 50 is lowered. In contrast, according to the example embodiment, as described above, the taper of the first and second side surfaces 50c and 50d of the MR element 50 can be made small, enabling suppression of occurrence of a problem due to the tapered shape of the first and second side surfaces 50c and 50d of the MR element 50.

Second Example Embodiment

Next, a manufacturing method for the magnetic sensor 1 according to a second example embodiment of the technology will be described. Here, the manufacturing method for the magnetic sensor 1 is described through description of a step of manufacturing the second chip 3.

In the following, the step of manufacturing the second chip 3 will be described with reference to FIGS. 27 to 30. FIGS. 27 to 30 each show a cross section of a stack in the process of manufacturing the second chip 3.

Figure 27:
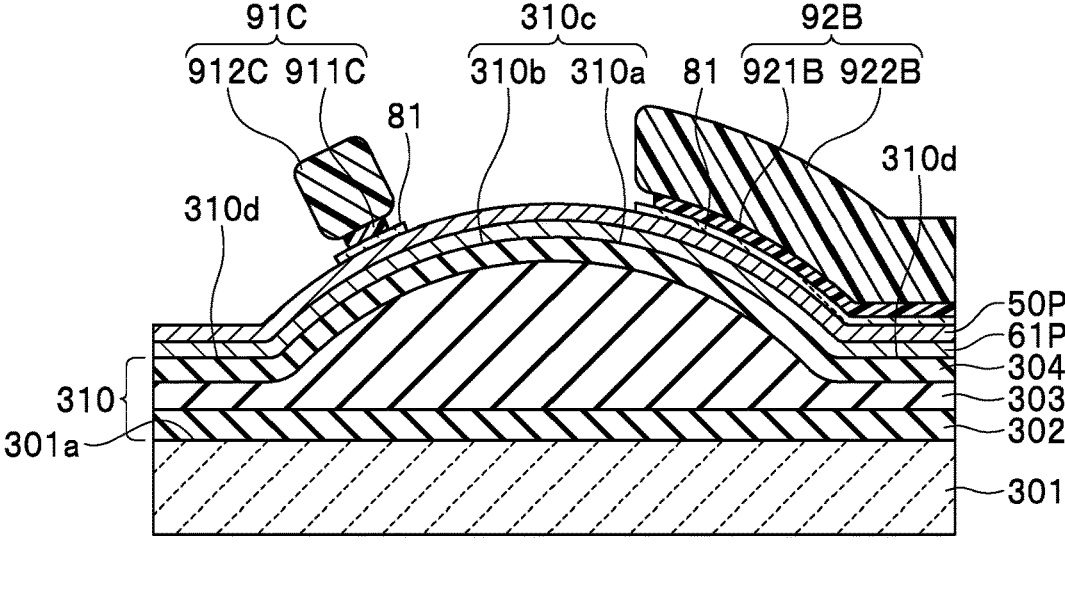
FIG. 27 is a sectional view showing a step in a manufacturing method for a magnetic sensor according to a second example embodiment of the technology.
Figure 27:
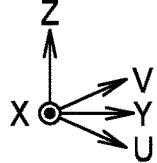

The step of manufacturing the second chip in the present example embodiment, until the step of forming the protective layer 81, is similar to that in the first example embodiment. FIG. 27 shows the next step. In this step, first, a plurality of masks 91C and a plurality of masks 92B are formed. The plurality of masks 91C have a shape corresponding to the plurality of third MR elements 50C. The plurality of masks 92B cover at least a part of the layered film 50P, the part being to later serve as the plurality of second MR elements 50B. A planer shape (shape when seen in the Z direction) of each of the plurality of masks 92B is larger than a planer shape of each of the plurality of second MR elements 50B.

The plurality of masks 91C each include a lower layer 911C lying on the protective layer 81 and an upper layer 912C lying on the lower layer 911C. The plurality of masks 92B each include a lower layer 921B lying on the protective layer 81 and an upper layer 922B lying on the lower layer 921B. The upper layers 912C and 922B are formed of the same material as the upper layers 822B and 822C described in the first example embodiment. The lower layers 911C and 921B are formed of the same material as the lower layers 821B and 821C described in the first example embodiment.

In the step shown in FIG. 27, a part of the protective layer 81 is then etched by using the plurality of masks 91C and the plurality of masks 92B, by RIE.

Figure 28:
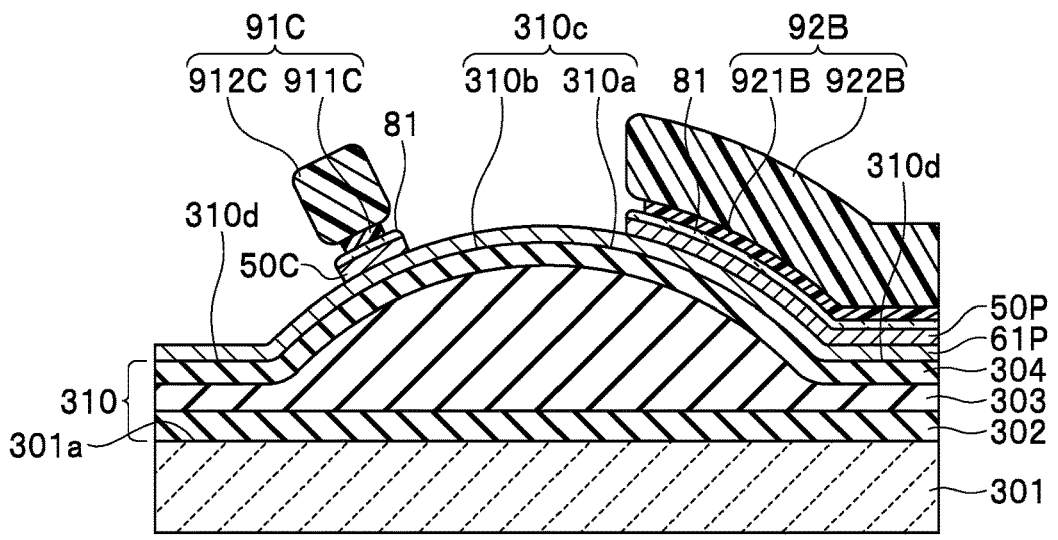
FIG. 28 is a sectional view showing a step that follows the step shown in FIG. 27.
Figure 28:
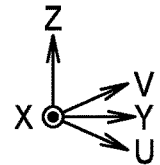

FIG. 28 shows the next step. In this step, first, a part of the layered film 50P is etched by using, as etching masks, the plurality of masks 91C, the plurality of masks 92B, and the protective layer 81, by IBE. In the etching, such a part of the layered film 50P is etched so that a part of the layered film 50P serves as the plurality of third MR elements 50C. In particular, in the etching, the direction of travel of the ion beam is tilted with respect to the direction perpendicular to the top surface 301a of the substrate 301, so that the first and second side surfaces 50c and 50d of each of the plurality of third MR elements 50C are formed in the layered film 50P. The plurality of masks 91C and the plurality of masks 92B are then removed.

Figure 29:
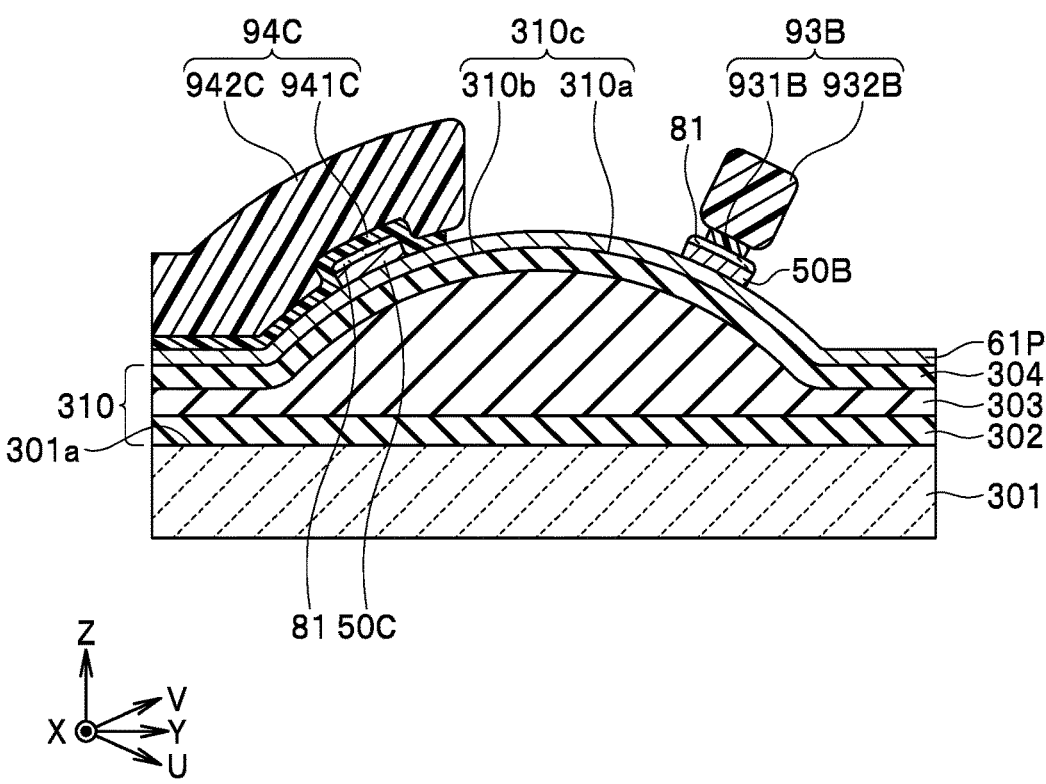
FIG. 29 is a sectional view showing a step that follows the step shown in FIG. 28.

FIG. 29 shows the next step. In this step, first, a plurality of masks 93B and a plurality of masks 94C are formed. The plurality of masks 93B have a shape corresponding to the plurality of second MR elements 50B. The plurality of masks 94C cover the plurality of third MR elements 50C. A planer shape of each of the plurality of masks 94C is larger than a planer shape of each of the plurality of third MR elements 50C.

The plurality of masks 93B each include a lower layer 931B lying on the protective layer 81 and an upper layer 932B lying on the lower layer 931B. The plurality of masks 94C each include a lower layer 941C lying on the plurality of third MR elements 50C, the metal film 61P, and the protective layer 81 and an upper layer 942C lying on the lower layer 941C. The upper layers 932B and 942C are formed of the same material as the upper layers 822B and 822C described in the first example embodiment. The lower layers 931B and 941C are formed of the same material as the lower layers 821B and 821C described in the first example embodiment.

Figure 30:
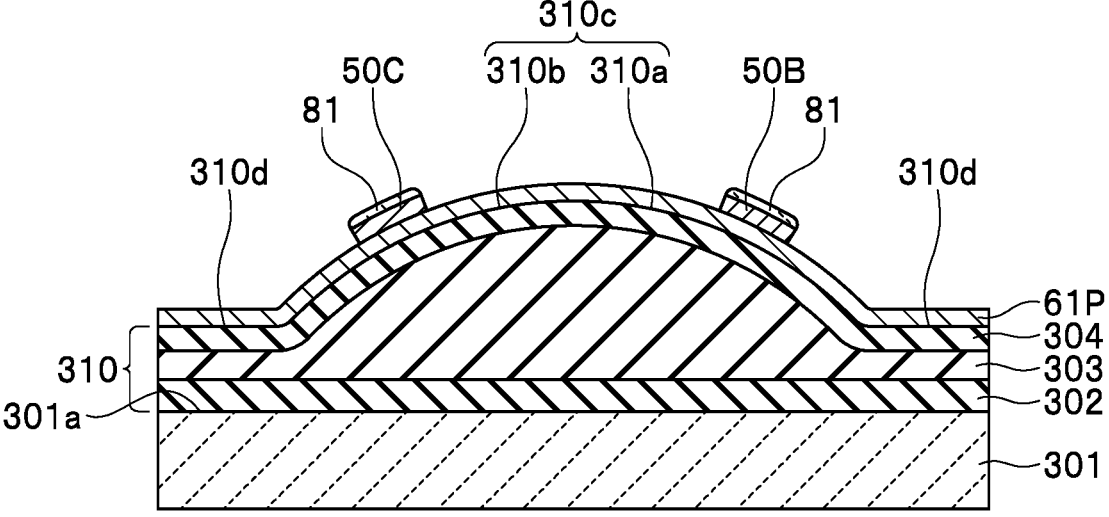
FIG. 30 is a sectional view showing a step that follows the step shown in FIG. 29.
Figure 30:
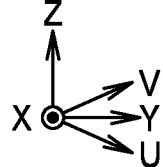

In the step shown in FIG. 29, another part of the protective layer 81 is then etched by using the plurality of masks 93B and the plurality of masks 94C, by RIE. Another part of the layered film 50P is then etched by using, as etching masks, the plurality of masks 93B, the plurality of masks 94C, and the protective layer 81, by IBE. In the etching, such another part of the layered film 50P is etched so that another part of the layered film 50P serves as the plurality of second MR elements 50B. In particular, in the etching, the direction of travel of the ion beam is tilted with respect to the direction perpendicular to the top surface 301a of the substrate 301, so that the first and second side surfaces 50c and 50d of each of the plurality of second MR elements 50B are formed in the layered film 50P. As shown in FIG. 30, the plurality of masks 93B and the plurality of masks 94C are then removed.

Similarly to the first example embodiment, the insulating layer 305 and the nonmagnetic metal layer 83 are then formed. The subsequent steps are similar to those in the first example embodiment.

The manufacturing method for the magnetic sensor 1 according to the present example embodiment is different from the first example embodiment in that the plurality of third MR elements 50C are formed first and then the plurality of second MR elements 50B are formed instead of forming the plurality of second MR elements 50B and the plurality of third MR elements 50C at the same time. In other words, the second etching step includes a step of forming the plurality of third MR elements 50C by etching a part of the layered film 50P and a step of forming the plurality of second MR elements 50B by etching another part of the layered film 50P after the step of forming the plurality of third MR elements 50C. Note that, in the example embodiment, the plurality of second MR elements 50B may be formed first and then the plurality of third MR elements 50C may be formed.

The configuration, operation, and effects of the present example embodiment are otherwise similar to those of the first example embodiment.

Third Example Embodiment

Figure 31:
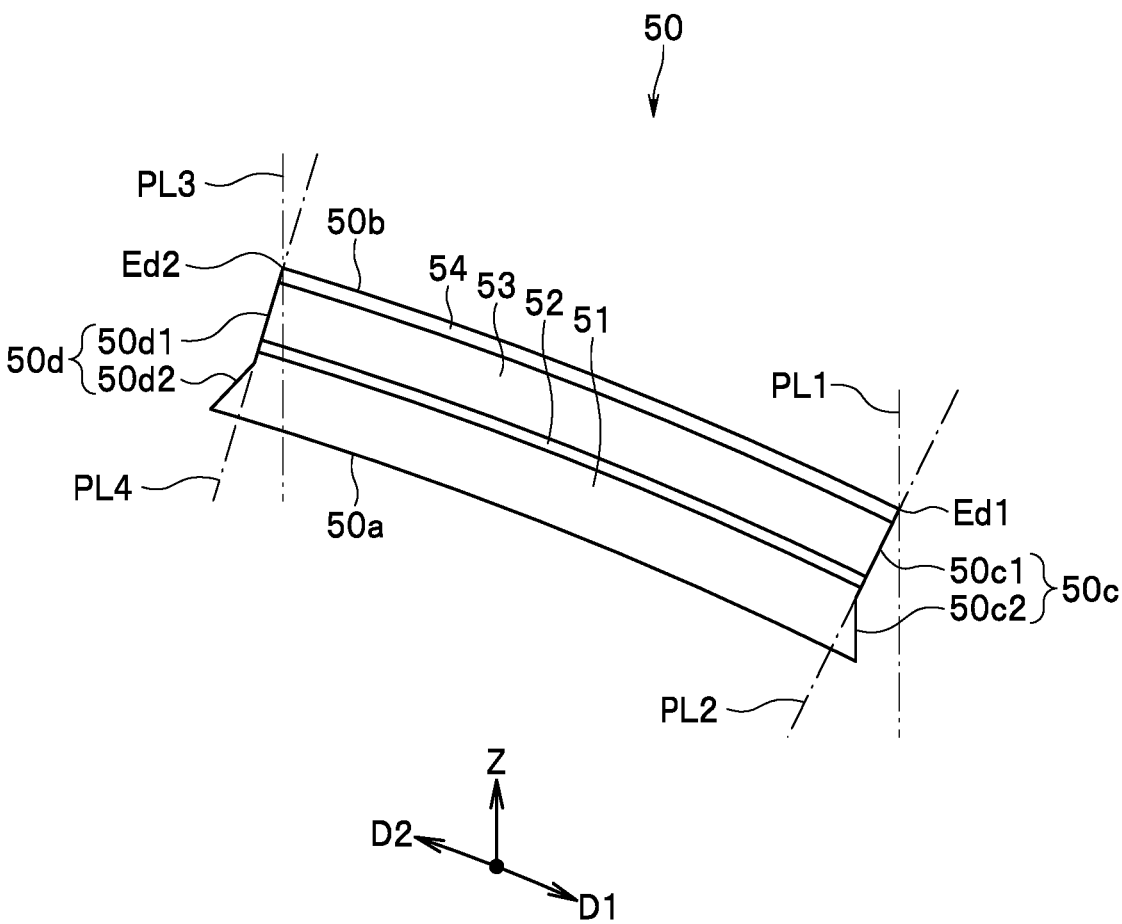
FIG. 31 is a sectional view showing a magnetoresistive element of a third example embodiment of the technology.

A third example embodiment of the technology will now be described with reference to FIG. 31. FIG. 31 is a sectional view showing an MR element 50 of the example embodiment. FIG. 31 shows, similarly to FIGS. 12 and 13 described in the first example embodiment, a cross section (YZ cross section) that intersects with an MR element 50 disposed on any given inclined surface 310e.

In the example embodiment, the first side surface 50c of the MR element 50 includes a first portion 50c1, and a second portion 50c2 located between the first portion 50cl and the support member 310 (see FIG. 12). The second portion 50c2 is located above the inclined surface 310e of the support member 310. The border between the first portion 50cl and the second portion 50c2 may be located at the magnetization pinned layer 51 or the gap layer 52. In the example shown in FIG. 31, the border described above is located at the magnetization pinned layer 51.

The first portion 50cl is, as compared to the first virtual plane PL1, located close to the second side surface 50d. In particular, in the example embodiment, the second portion 50c2 is also, as compared to the first virtual plane PL1, located close to the second side surface 50d.

In the example shown in FIG. 31, an angle that the first portion 50cl forms with respect to the second virtual plane PL2 is 0° or substantially 0°. In other words, in the example shown in FIG. 31, the first portion 50cl is perpendicular or substantially perpendicular to the inclined surface 310e at a part facing the first side surface 50c. Note that the first portion 50cl may be inclined relative to the second virtual plane PL2. The angle that the first portion 50cl forms with respect to the second virtual plane PL2 may be in the range of 0° to 20°.

An angle that the second portion 50c2 forms with respect to the second virtual plane PL2 is greater than the angle that the first portion 50cl forms with respect to the second virtual plane PL2.

In the example embodiment, the second side surface 50d of the MR element 50 includes a third portion 50d1, and a fourth portion 50d2 located between the third portion 50d1 and the support member 310 (see FIG. 12). The fourth portion 50d2 is located above the inclined surface 310e of the support member 310. The border between the third portion 50d1 and the fourth portion 50d2 may be located at the magnetization pinned layer 51 or the gap layer 52. In the example shown in FIG. 31, the border described above is located at the magnetization pinned layer 51.

The third portion 50d1 is, as compared to the third virtual plane PL3, located far from the first side surface 50c. In particular, in the example embodiment, the fourth portion 50d2 is also, as compared to the third virtual plane PL3, located far from the first side surface 50c.

In the example shown in FIG. 31, an angle that the third portion 50d1 forms with respect to the fourth virtual plane PL4 is 0° or substantially 0°. In other words, in the example shown in FIG. 31, the third portion 50d1 is perpendicular or substantially perpendicular to the inclined surface 310e at a part facing the second side surface 50d. Note that the third portion 50d1 may be inclined relative to the fourth virtual plane PL4. The angle that the third portion 50d1 forms with respect to the fourth virtual plane PL4 may be in the range of 0° to 20°.

An angle that the fourth portion 50d2 forms with respect to the fourth virtual plane PL4 is greater than the angle that the third portion 50d1 forms with respect to the fourth virtual plane PL4.

The first portion 50cl and the third portion 50d1 are preferably substantially parallel to each other. In other words, an angle that the first portion 50c1 forms with respect to the third portion 50d1 is preferably small at a certain extent. The angle that the first portion 50c1 forms with respect to the third portion 50d1 is preferably smaller than an angle that the third portion 50d1 forms with respect to the third virtual plane PL3, for example.

The configuration, operation, and effects of the present example embodiment are otherwise similar to those of the first example embodiment.

Fourth Example Embodiment

Figure 32:
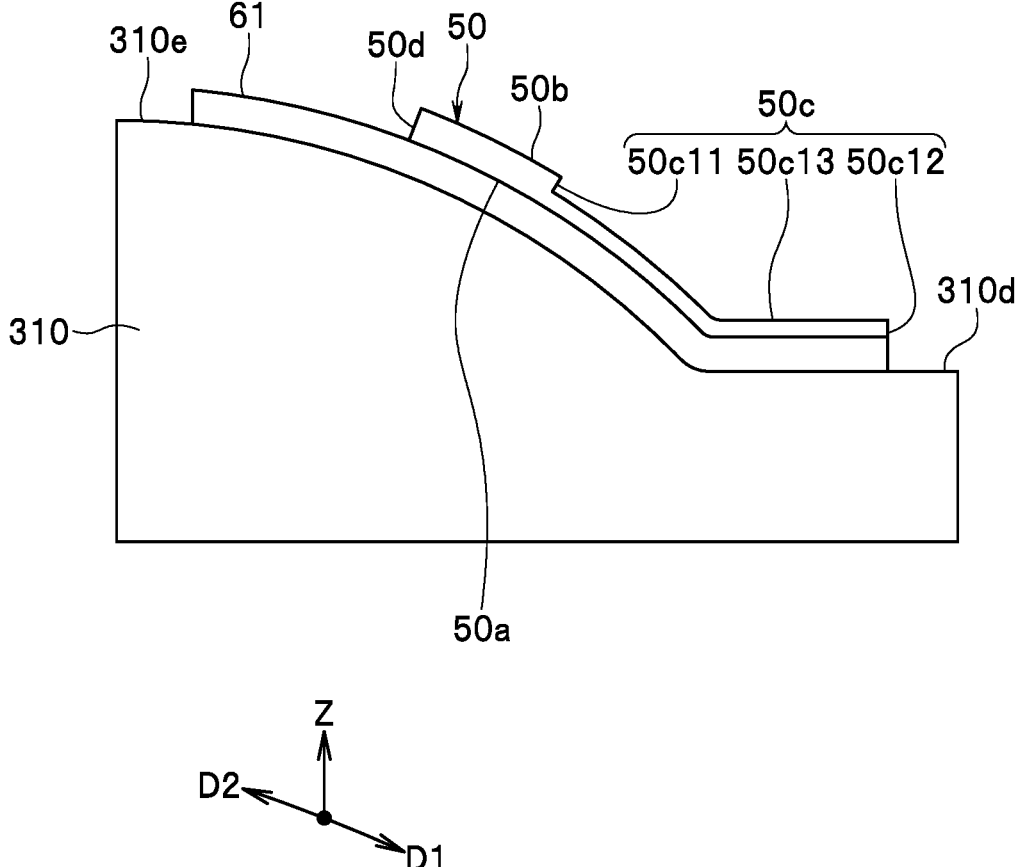
FIG. 32 is a sectional view showing a magnetoresistive element, a lower electrode, and a support member of a fourth example embodiment of the technology.

A fourth example embodiment of the technology will now be described with reference to FIG. 32. FIG. 32 is a sectional view showing an MR element 50, a lower electrode 61, and the support member 310 of the example embodiment. FIG. 32 shows, similarly to FIG. 12 described in the first example embodiment, a cross section (YZ cross section) that intersects with an MR element 50 disposed on any given inclined surface 310e.

In the example embodiment, the first side surface 50c of the MR element 50 includes a first portion 50c11, a second portion 50c12 located between the first portion 50c11 and the support member 310, and a third portion 50c13 connecting the first portion 50c11 and the second portion 50c12. The border between the first portion 50c11 and the third portion 50c13 may be located at the magnetization pinned layer 51 or the gap layer 52. The second portion 50c12 may be located above the flat surface 310d of the support member 310.

Structural features of the first portion 50c11 are similar to structural features of the first portion 50cl in the third example embodiment. The configuration, operation, and effects of the present example embodiment are otherwise similar to those of the first or third example embodiment.

Fifth Example Embodiment

Figure 33:
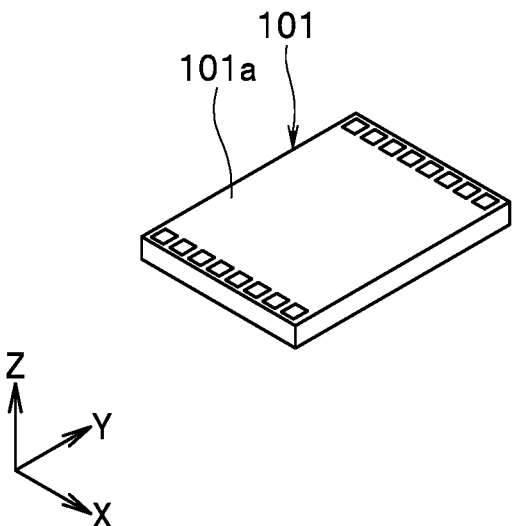
FIG. 33 is a perspective view showing a magnetic sensor according to a fifth example embodiment of the technology.
Figure 34:
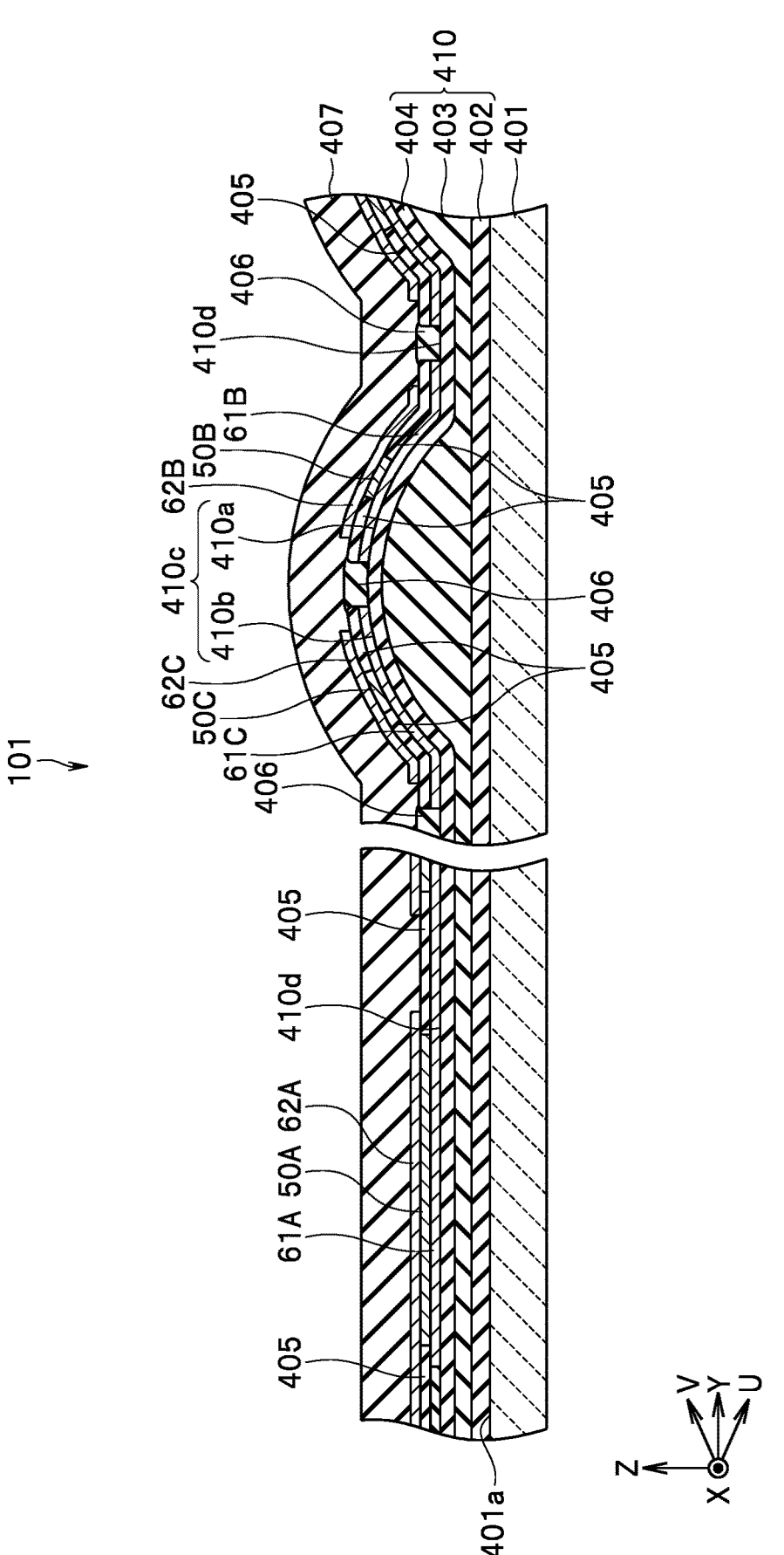
FIG. 34 is a sectional view showing a part of the magnetic sensor of the fifth example embodiment of the technology.

A fifth example embodiment of the technology will now be described with reference to FIGS. 33 and 34. FIG. 33 is a perspective view showing a magnetic sensor according to the example embodiment. FIG. 34 is a sectional view showing a part of the magnetic sensor according to the example embodiment.

A magnetic sensor 101 according to the example embodiment is equivalent to the first and second chips 2 and 3 according to the first example embodiment integrated. As shown in FIG. 33, the magnetic sensor 101 has the shape of a rectangular solid chip. The magnetic sensor 101 has a top surface 101a and a bottom surface located opposite to each other, and four side surfaces connecting the top surface 101a and the bottom surface. The magnetic sensor 101 also includes a plurality of electrode pads disposed on the top surface 101a.

The magnetic sensor 101 may be mounted on the support 4 shown in FIGS. 1 and 2 according to the first example embodiment. In such a case, the magnetic sensor 101 is mounted on the reference plane 4*a* of the support 4 with the bottom surface of the magnetic sensor 101 facing the reference plane 4*a*.

The magnetic sensor 101 includes the first to third detection circuits 10, 20, and 30 shown in FIGS. 3 to 6 according to the first example embodiment. The configuration and operation of each of the first to third detection circuits 10, 20, and 30 are similar to those in the first example embodiment. More specifically, the first detection circuit 10 includes a plurality of first MR elements 50A. The second detection circuit 20 includes a plurality of second MR elements 50B. The third detection circuit 30 includes a plurality of third MR elements 50C.

The magnetic sensor 101 further includes the plurality of lower electrodes 61A, 61B, and 61C and the plurality of upper electrodes 62A, 62B, and 62C described in the first example embodiment. The respective methods for connecting the plurality of first MR elements 50A, the plurality of second MR elements 50B, and the plurality of third MR elements 50C are similar to those in the first example embodiment.

As shown in FIG. 34, the magnetic sensor 101 further includes a substrate 401 having a top surface 401*a*, and insulating layers 402, 403, 404, 405, 406, and 407. The top surface 401*a* of the substrate 401 is parallel to the XY plane. The Z direction is also a direction perpendicular to the top surface 401*a* of the substrate 401.

The insulating layers 402, 403, and 404 are stacked on the substrate 401. In the present example embodiment, the plurality of lower electrodes 61A, the plurality of lower electrodes 61B, and the plurality of lower electrodes 61C are disposed on the insulating layer 404. The insulating layer 405 is disposed, on the plurality of lower electrodes 61A, around the plurality of first MR elements 50A, is disposed, on the plurality of lower electrodes 61B, around the plurality of second MR elements 50B, and is disposed, on the plurality of lower electrodes 61C, around the plurality of third MR elements 50C.

The insulating layer 406 is disposed, on the insulating layer 404, around the plurality of lower electrodes 61A, the plurality of lower electrodes 61B, the plurality of lower electrodes 61C, and the insulating layer 405. The plurality of upper electrodes 62A are disposed on the plurality of first MR elements 50A and the insulating layer 405. The plurality of upper electrodes 62B are disposed on the plurality of second MR elements 50B and the insulating layer 405. The plurality of upper electrodes 62C are disposed on the plurality of third MR elements 50C and the insulating layer 405. The insulating layer 407 is disposed on the plurality of upper electrodes 62A, the plurality of upper electrodes 62B, the plurality of upper electrodes 62C, and the insulating layers 405 and 406.

The magnetic sensor 101 includes a support member 410 that supports the plurality of MR elements 50. The support member 410 includes the insulating layers 402, 403, and 404. The support member 410 has a plurality of protruding surfaces 410*c* each protruding in a direction away from the top surface 401*a* of the substrate 401 (Z direction) and a flat surface 410*d* around the plurality of protruding surfaces 410*c*. The plurality of protruding surfaces 410*c* have the same shape and layout as those of the plurality of protruding surfaces 310*c* of the first example embodiment.

The plurality of protruding surfaces 410*c* each include a first inclined surface 410*a* and a second inclined surface 410*b*. The support member 410 thus includes a plurality of the first inclined surfaces 410*a* and a plurality of the second inclined surfaces 410*b*. The plurality of first inclined sur-faces 410*a* have the same shape and layout as those of the plurality of first inclined surfaces 310*a* of the first example embodiment. The plurality of second inclined surfaces 410*b* have the same shape and layout as those of the plurality of second inclined surfaces 310*b* of the first example embodiment.

The magnetic sensor 101 includes a first portion where the plurality of first MR elements 50A are disposed and a second portion where the plurality of second MR elements 50B and the plurality of third MR elements 50C are disposed. The plurality of protruding surfaces 410*c* are substantially formed by parts of the insulating layer 403 belonging to the second portion. In other words, the foregoing parts of the insulating layer 403 include a plurality of protrusions each protruding in the Z direction. The plurality of protrusions each extend in the direction parallel to the X direction and have a top surface having a shape corresponding to the protruding surface 410*c*. The plurality of protrusions are arranged at predetermined intervals along the direction parallel to the Y direction.

The insulating layer 403 further includes a flat portion. The flat portion has a substantially constant thickness (dimension in the Z direction). The flat surface 410*d* is substantially formed by the flat portion of the insulating layer 403 belonging to the first portion of the magnetic sensor 101 and the flat portion lying around the plurality of protrusions in the second portion of the magnetic sensor 101.

The insulating layer 404 has a substantially constant thickness (dimension in the Z direction) and is formed along the top surface of the insulating layer 403. The top surface of the insulating layer 404 thus forms the plurality of protruding surfaces 410*c* and the flat surface 410*d*. The insulating layer 402 has a substantially constant thickness (dimension in the Z direction) and is formed along the bottom surface of the insulating layer 403.

In the example embodiment, the plurality of lower electrodes 61A are disposed on the flat surface 410*d*. The top surface 401*a* of the substrate 401 is parallel to the XY plane. The top surface of each of the plurality of lower electrodes 61A is also parallel to the XY plane.

In the example embodiment, the plurality of lower electrodes 61B are disposed on the plurality of first inclined surfaces 410*a*. The plurality of lower electrodes 61C are disposed on the plurality of second inclined surfaces 410*b*. Since each of the first inclined surfaces 410*a* and the second inclined surfaces 410*b* is inclined relative to the top surface 401*a* of the substrate 401, i.e., the XY plane, the top surface of each of the plurality of lower electrodes 61B and the top surface of each of the plurality of lower electrodes 61C are also inclined relative to the XY plane.

The configuration, operation, and effects of the present example embodiment are otherwise similar to those of the first example embodiment.

Sixth Example Embodiment

Figure 35:
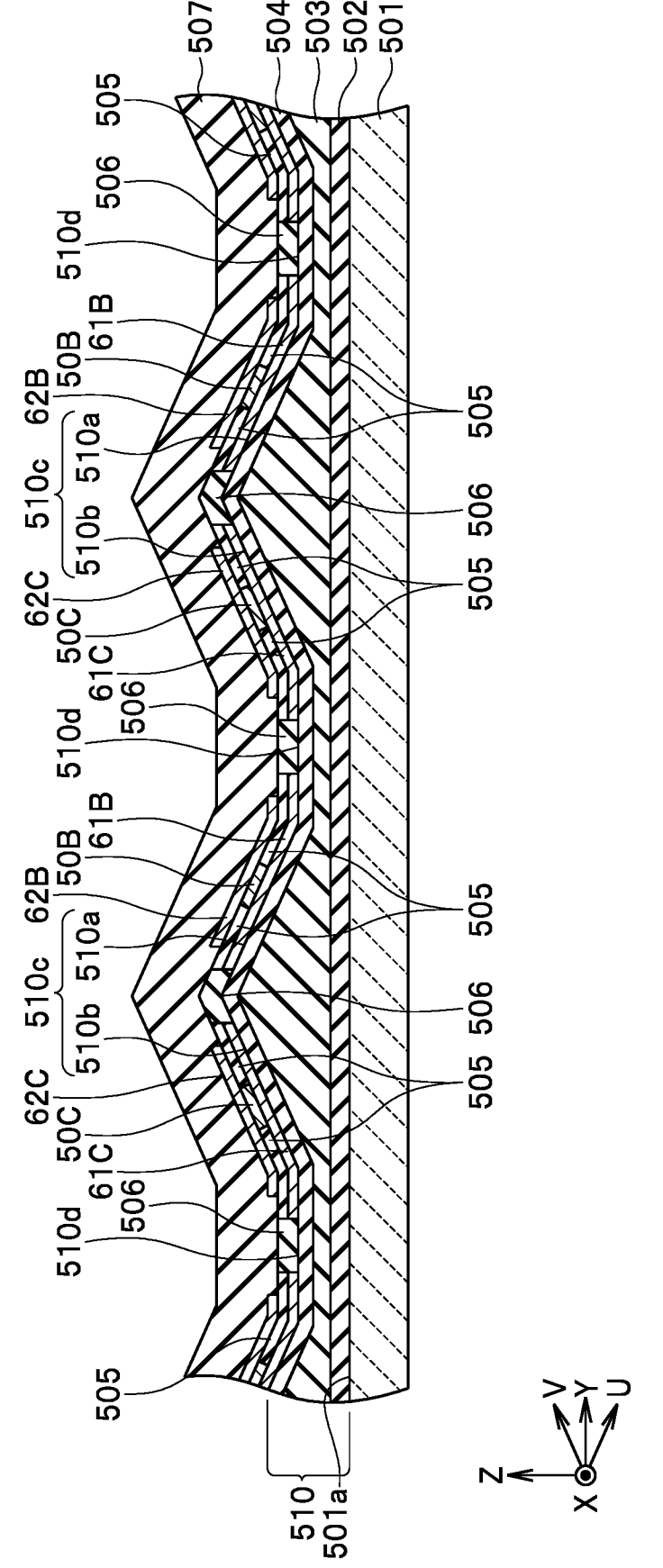
FIG. 35 is a sectional view showing a part of a second chip of a sixth example embodiment of the technology.

A sixth example embodiment of the technology will now be described with reference to FIG. 35. FIG. 35 is a sectional view showing a part of a second chip of the example embodiment.

A magnetic sensor 1 according to the example embodiment includes a second chip 103, instead of the second chip 3 in the first example embodiment. The external shape of the second chip 103 is similar to the external shape of the second chip 3. In other words, the second chip 103 has a top surface and a bottom surface located opposite to each other, and four side surfaces connecting the top surface and the bottom surface. The second chip 103 is mounted on the reference plane 4a in a posture such that the bottom surface of the second chip 103 faces the reference plane 4a of the support 4 (see FIGS. 1 and 2). The second chip 103 has a plurality of second electrode pads disposed on the top surface.

The second chip 103 includes the second detection circuit 20 and third detection circuit 30 shown in FIGS. 3, 5, and 6. The configuration and operation of each of the second and third detection circuits 20 and 30 are similar to those in the first example embodiment. In other words, the second detection circuit 20 includes the plurality of second MR elements 50B. The third detection circuit 30 includes the plurality of third MR elements 50C.

The second chip 103 further includes the plurality of lower electrodes 61B and 61C and the plurality of upper electrodes 62B and 62C described in the first example embodiment. The respective methods for connecting the plurality of second MR elements 50B and the plurality of third MR elements 50C are similar to those in the first example embodiment.

As shown in FIG. 35, the second chip 103 further includes a substrate 501 having a top surface 501a and insulating layers 502, 503, 504, 505, 506, and 507. The top surface 501a of the substrate 501 is parallel to the XY plane. The Z direction is also a direction perpendicular to the top surface 501a of the substrate 501.

The insulating layers 502, 503, and 504 are stacked on the substrate 501. In the present example embodiment, the plurality of lower electrodes 61B and the plurality of lower electrodes 61C are disposed on the insulating layer 504. The insulating layer 505 is disposed, on the plurality of lower electrodes 61B, around the plurality of second MR elements 50B and is disposed, on the plurality of lower electrodes 61C, around the plurality of third MR elements 50C.

The insulating layer 506 is disposed, on the insulating layer 504, around the plurality of lower electrodes 61B, the plurality of lower electrodes 61C, and the insulating layer 505. The plurality of upper electrodes 62B are disposed on the plurality of second MR elements 50B and the insulating layer 505. The plurality of upper electrodes 62C are disposed on the plurality of third MR elements 50C and the insulating layer 505. The insulating layer 507 is disposed on the plurality of upper electrodes 62B, the plurality of upper electrodes 62C, and the insulating layers 505 and 506.

The second chip 103 includes a support member 510 that supports the plurality of MR elements 50. The support member 510 includes the insulating layers 502, 503, and 504. The support member 510 has a plurality of protruding surfaces 510c each protruding in a direction away from the top surface 501a of the substrate 501 (Z direction) and a flat surface 510d around the plurality of protruding surfaces 510c. The overall shape of each of the plurality of protruding surfaces 510c is a triangular roof-like shape formed by moving the triangular shape of the protruding surface 510c shown in FIG. 35 along the direction parallel to the X direction.

The plurality of protruding surfaces 510c each include a first inclined surface 510a and a second inclined surface 510b. The support member 510 thus includes a plurality of the first inclined surfaces 510a and a plurality of the second inclined surfaces 510b. Each of the plurality of first inclined surfaces 510a and the plurality of second inclined surfaces 510b is a flat surface or substantially a flat surface. Each of the plurality of first inclined surfaces 510a is parallel to or substantially parallel to the X direction and the U direction. Each of the plurality of second inclined surfaces 510b is parallel to or substantially parallel to the X direction and the V direction. An angle that each of the plurality of first inclined surfaces 510a and the plurality of second inclined surfaces 510b forms with respect to the top surface 501a of the substrate 501 is in the range of 10° to 50°, for example.

The insulating layer 503 includes a plurality of protrusions each protruding in the Z direction. The plurality of protrusions each extend in the direction parallel to the X direction and have a top surface having a shape corresponding to the protruding surface 510c. The plurality of protrusions are arranged at predetermined intervals along the direction parallel to the Y direction.

The insulating layer 503 further includes a flat portion. The flat portion has a substantially constant thickness (dimension in the Z direction). The insulating layer 504 has a substantially constant thickness (dimension in the Z direction) and is formed along the top surface of the insulating layer 503. The top surface of the insulating layer 504 thus forms the plurality of protruding surfaces 510c and the flat surface 510d.

The insulating layer 502 has a substantially constant thickness (dimension in the Z direction) and is formed along the bottom surface of the insulating layer 503.

In the example embodiment, the plurality of lower electrodes 61B are disposed on the plurality of first inclined surfaces 510a. The plurality of lower electrodes 61C are disposed on the plurality of second inclined surfaces 510b. Since each of the first inclined surfaces 510a and the second inclined surfaces 510b is inclined relative to the top surface 501a of the substrate 501, i.e., the XY plane, the top surface of each of the plurality of lower electrodes 61B and the top surface of each of the plurality of lower electrodes 61C are also inclined relative to the XY plane.

The configuration, operation, and effects of the present example embodiment are otherwise similar to those of the first example embodiment.

The technology is not limited to the foregoing example embodiments, and various modifications may be made thereto. For example, as long as the requirements of the appended claims are met, the shape of the first side surface 50c and the second side surface 50d of the MR element 50 is not limited to the examples illustrated in the foregoing embodiments but can be freely chosen. For example, at least a part of each of the first side surface 50c and the second side surface 50d may be a curved surface. In the example embodiments, the first side surface 50c and the second side surface 50d are drawn such that the distance between the first and second side surfaces 50c and 50d increases with increasing distance from the inclined surface 310e. The distance between the first and second side surfaces 50c and 50d may, however, be constant or substantially constant regardless of the distance from the inclined surface 310e, or may decreases with increasing the distance from the inclined surface 310e.

As described above, a magnetic sensor according to an embodiment of the technology includes a substrate having a reference plane, a support member that is disposed on the substrate and that has an inclined surface inclined relative to the reference plane, and a magnetoresistive element disposed on the inclined surface. The magnetoresistive element has a bottom surface facing the inclined surface, a top surface located opposite to the bottom surface, and a first side surface and a second side surface connecting the bottom surface and the top surface. The first side surface is, as compared to the second side surface, located in front in a first direction that is along the inclined surface and that gets close to the reference plane. The second side surface is, as compared to the first side surface, located in front in a second direction that is along the inclined surface and that gets away from the reference plane. At least a part of the first side surface is, as compared to a first virtual plane, located close to the second side surface, and the first virtual plane intersects with a first corner present at a position at where the top surface and the first side surface intersect and is perpendicular to the reference plane.

In the magnetic sensor according to an embodiment of the technology, an angle that the at least a part of the first side surface forms with respect to the second virtual plane may be in the range of 0° to 20°, and the second virtual plane intersects with the first corner and is perpendicular to the inclined surface.

In the magnetic sensor according to an embodiment of the technology, the first side surface may include a first portion and a second portion located between the first portion and the support member. An angle that the second portion forms with respect to the second virtual plane may be greater than the angle that the first portion forms with respect to the second virtual plane, and the second virtual plane intersects with the first corner and is perpendicular to the inclined surface. The magnetoresistive element may include a free layer having a magnetization whose direction is variable depending on an external magnetic field, a magnetization pinned layer that has a magnetization whose direction is fixed, and a gap layer located between the free layer and the magnetization pinned layer. The border between the first portion and the second portion may be located at the magnetization pinned layer or the gap layer.

In the magnetic sensor according to an embodiment of the technology, the magnetoresistive element may include a free layer having a magnetization whose direction is variable depending on an external magnetic field, a magnetization pinned layer that has a magnetization whose direction is fixed and that is interposed between the free layer and the inclined surface, and a gap layer located between the free layer and the magnetization pinned layer. The magnetoresistive element may further include a cap layer that is formed of a nonmagnetic metal and that is located on the free layer.

In the magnetic sensor according to an embodiment of the technology, an angle that at least a part of the first side surface forms with respect to at least a part of the second side surface may be smaller than an angle that the at least a part of the second side surface forms with respect to a third virtual plane, and the third virtual plane intersects with a second corner present at a position at where the top surface and the second side surface intersect and is perpendicular to the reference plane.

In the magnetic sensor according to an embodiment of the technology, the second side surface may include a third portion and a fourth portion located between the third portion and the support member. An angle that the fourth portion forms with respect to a fourth virtual plane may be greater than an angle that the third portion forms with respect to the fourth virtual plane, and the fourth virtual plane intersects with the second corner present at a position at where the top surface and the second side surface intersect and is perpendicular to the inclined surface.

The magnetic sensor according to an embodiment of the technology may further include a different magnetoresistive element. The inclined surface may include a first surface and a second surface oriented in directions different from each other. The magnetoresistive element may be disposed on the first surface. The different magnetoresistive element may be disposed on the second surface.

In the magnetic sensor according to an embodiment of the technology, an angle that a part, of the inclined surface, facing the magnetoresistive element forms with respect to the reference plane may be in the range of 10° to 50°.

A manufacturing method for the magnetic sensor according to an embodiment of the technology includes a step of forming the support member on the substrate and a step of forming the magnetoresistive element. The step of forming the magnetoresistive element includes a step of forming a layered film on the inclined surface of the support member, the layered film including a plurality of magnetic layers, a step of forming a protective layer on the layered film, a step of forming a mask, a first etching step of etching a part of the protective layer by using the mask, and a second etching step of etching the layered film by using the mask and the etched protective layer, so that the layered film serves as the magnetoresistive element.

The manufacturing method for the magnetic sensor according to an embodiment of the technology may further include a step of forming the insulating layer after the second etching step, and a step of removing the protective layer after the step of forming the insulating layer.

In the manufacturing method for the magnetic sensor according to an embodiment of the technology, the magnetic sensor may further include a different magnetoresistive element. The inclined surface may include a first surface and a second surface oriented in directions different from each other. The magnetoresistive element may be disposed on the first surface. The different magnetoresistive element may be disposed on the second surface. The magnetoresistive element and the different magnetoresistive element may be formed at the same time in the second etching step. Alternatively, the second etching step may include a step of forming the magnetoresistive element by etching a part of the layered film and a step of forming the different magnetoresistive element by etching another part of the layered film after the step of forming the magnetoresistive element.

In the manufacturing method for the magnetic sensor according to an embodiment of the technology, the protective layer may be formed of carbon or alumina.

Obviously, various modification examples and variations of the technology are possible in the light of the above teachings. Thus, it is to be understood that, within the scope of the appended claims and equivalents thereof, the technology may be practiced in other embodiments than the foregoing example embodiments.

What is claimed is:

1. A magnetic sensor comprising:
   a substrate having a reference plane;
   a support member that is disposed on the substrate and that has an inclined surface inclined relative to the reference plane; and
   a magnetoresistive element disposed on the inclined surface, wherein
   the magnetoresistive element has a bottom surface facing the inclined surface, a top surface located opposite to the bottom surface, and a first side surface and a second side surface connecting the bottom surface and the top surface,
   the first side surface is, as compared to the second side surface, located in front in a first direction that is along the inclined surface and that gets close to the reference plane,
   the second side surface is, as compared to the first side surface, located in front in a second direction that is along the inclined surface and that gets away from the reference plane, and
   at least a part of the first side surface is, as compared to a first virtual plane, located close to the second side surface, and the first virtual plane intersects with a first corner present at a position at where the top surface and the first side surface intersect and is perpendicular to the reference plane.

2. The magnetic sensor according to claim 1, wherein an angle that the at least a part of the first side surface forms with respect to a second virtual plane is in a range of 0° to 20°, and the second virtual plane intersects with the first corner and is perpendicular to the inclined surface.

3. The magnetic sensor according to claim 1, wherein the first side surface includes a first portion and a second portion located between the first portion and the support member, and an angle that the second portion forms with respect to a second virtual plane is greater than an angle that the first portion forms with respect to the second virtual plane, and the second virtual plane intersects with the first corner and is perpendicular to the inclined surface.

4. The magnetic sensor according to claim 3, wherein the magnetoresistive element includes a free layer having a magnetization whose direction is variable depending on an external magnetic field, a magnetization pinned layer having a magnetization whose direction is fixed, and a gap layer located between the free layer and the magnetization pinned layer, and a border between the first portion and the second portion is located at the magnetization pinned layer or the gap layer.

5. The magnetic sensor according to claim 1, wherein the magnetoresistive element includes a free layer having a magnetization whose direction is variable depending on an external magnetic field, a magnetization pinned layer that has a magnetization whose direction is fixed and that is interposed between the free layer and the inclined surface, and a gap layer located between the free layer and the magnetization pinned layer.

6. The magnetic sensor according to claim 5, wherein the magnetoresistive element further includes a cap layer that is formed of a nonmagnetic metal and that is located on the free layer.

7. The magnetic sensor according to claim 1, wherein an angle that the at least a part of the first side surface forms with respect to at least a part of the second side surface is smaller than an angle that the at least a part of the second side surface forms with respect to a third virtual plane, and the third virtual plane intersects with a second corner present at a position at where the top surface and the second side surface intersect and is perpendicular to the reference plane.

8. The magnetic sensor according to claim 1, wherein the second side surface includes a third portion and a fourth portion located between the third portion and the support member, and an angle that the fourth portion forms with respect to a fourth virtual plane is greater than an angle that the third portion forms with respect to the fourth virtual plane, and the fourth virtual plane intersects with a second corner present at a position at where the top surface and the second side surface intersect and is perpendicular to the inclined surface.

9. The magnetic sensor according to claim 1, further comprising:

a different magnetoresistive element, wherein the inclined surface includes a first surface and a second surface oriented in directions different from each other, the magnetoresistive element is disposed on the first surface, and the different magnetoresistive element is disposed on the second surface.

10. The magnetic sensor according to claim 1, wherein an angle that a part, of the inclined surface, facing the magnetoresistive element forms with respect to the reference plane is in a range of 10° to 50°.

11. A manufacturing method for the magnetic sensor according to claim 1, the manufacturing method comprising:

a step of forming the support member on the substrate; and a step of forming the magnetoresistive element, wherein the step of forming the magnetoresistive element includes a step of forming a layered film on the inclined surface of the support member, the layered film including a plurality of magnetic layers, a step of forming a protective layer on the layered film, a step of forming a mask, a first etching step of etching a part of the protective layer by using the mask, and a second etching step of etching the layered film by using the mask and the protective layer etched, so that the layered film serves as the magnetoresistive element.

12. The manufacturing method for the magnetic sensor according to claim 11, further comprising:

a step of forming an insulating layer after the second etching step, and a step of removing the protective layer after the step of forming the insulating layer.

13. The manufacturing method for the magnetic sensor according to claim 11, wherein the magnetic sensor further includes a different magnetoresistive element, the inclined surface includes a first surface and a second surface oriented in directions different from each other, the magnetoresistive element is disposed on the first surface, the different magnetoresistive element is disposed on the second surface, and the magnetoresistive element and the different magnetoresistive element are formed at the same time in the second etching step.

14. The manufacturing method for the magnetic sensor according to claim 11, wherein the magnetic sensor further includes a different magnetoresistive element, the inclined surface includes a first surface and a second surface oriented in directions different from each other, the magnetoresistive element is disposed on the first surface, the different magnetoresistive element is disposed on the second surface, the second etching step includes a step of forming the magnetoresistive element by etching a part of the layered film, and a step of forming the different magnetoresistive element by etching another part of the layered film after the step of forming the magnetoresistive element.

15. The manufacturing method for the magnetic sensor according to claim 11, wherein the protective layer is formed of carbon or alumina.

* * * * *